United States Patent
Akiyoshi

(10) Patent No.: US 7,372,303 B2
(45) Date of Patent: May 13, 2008

(54) SEMICONDUCTOR INTEGRATED CIRCUIT

(75) Inventor: Hideo Akiyoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 60 days.

(21) Appl. No.: 11/414,333

(22) Filed: May 1, 2006

(65) Prior Publication Data
US 2007/0170954 A1   Jul. 26, 2007

(30) Foreign Application Priority Data
Jan. 12, 2006 (JP) ............. 2006-004569

(51) Int. Cl.
*H03K 19/094* (2006.01)
*H03K 19/0175* (2006.01)
(52) U.S. Cl. .................. 326/83; 326/86
(58) Field of Classification Search ......... 326/56–58, 326/82–83, 86–87
See application file for complete search history.

(56) References Cited

U.S. PATENT DOCUMENTS

| | | | |
|---|---|---|---|
| 5,115,150 A * | 5/1992 | Ludwig | 326/86 |
| 5,206,544 A * | 4/1993 | Chen et al. | 326/30 |
| 5,426,383 A * | 6/1995 | Kumar | 326/119 |
| 5,491,432 A * | 2/1996 | Wong et al. | 326/86 |
| 5,869,984 A * | 2/1999 | Eto | 326/86 |
| 6,097,216 A * | 8/2000 | Youn | 326/71 |
| 6,133,762 A * | 10/2000 | Hill et al. | 326/119 |
| 6,331,787 B1 * | 12/2001 | Whitworth et al. | 326/30 |
| 6,522,173 B1 * | 2/2003 | Otsuka | 326/101 |
| 2003/0137326 A1 * | 7/2003 | Okada | 327/108 |

FOREIGN PATENT DOCUMENTS

| | | |
|---|---|---|
| JP | 09-190693 | 7/1997 |
| JP | 09-294063 | 11/1997 |

* cited by examiner

*Primary Examiner*—James Cho
*Assistant Examiner*—Jason Crawford
(74) *Attorney, Agent, or Firm*—Arent Fox, PLLC

(57) ABSTRACT

A driver circuit for a signal line of a large load is configured to include: a pMOS transistor having a source and a drain connected with a signal line and a ground line, respectively, and a gate receiving an input signal; and an nMOS transistor having a source and a drain connected with a signal line and a power supply line, respectively, and a gate receiving the input signal. As a result, the power consumption due to the signal line of a large load is reduced to realize a reduction of the power consumption of a semiconductor integrated circuit.

15 Claims, 24 Drawing Sheets

SEMICONDUCTOR INTEGRATED CIRCUIT

CROSS REFERENCE TO RELATED APPLICATION

This application is based upon and claims the benefit of priority from Japanese Patent Application No. 2006-004569, filed on Jan. 12, 2006, the entire contents of which are incorporated herein by reference.

BACKGROUND OF THE INVENTION

1. Field of the Invention

The present invention relates to a semiconductor integrated circuit and, more particularly, to a technique for reducing the power consumption of a semiconductor integrated circuit.

2. Description of the Related Art

Recently, mobile electronic devices (e.g., a mobile telephone) driven by a battery have been commonly used. There have been a strong demand for a semiconductor integrated circuit to be mounted on those mobile electronic devices to have a high-speed operation in order to achieve the advanced functions of the electronic devices and to have a low power consumption for enabling the battery to run for a long time.

In the semiconductor integrated circuit constituted of a plurality of circuit blocks, the wiring lengths of inter-block signal lines (e.g., global signal lines) for transmitting signals between the circuit blocks have been increasing, causing one of major factors to deteriorate the performances (e.g., the operation speed or the power consumption) of the semiconductor integrated circuit. In view of solving the problem, there have been developed the techniques for improving the performances of the semiconductor integrated circuit having the signal lines of long wiring lengths. For example, Japanese Unexamined Patent Application Publication No. 9-294063 discloses a technique for relaxing the voltage fluctuations of a power supply line by speeding up the signal transmissions through signal lines of long wiring lengths.

Further, Japanese Unexamined Patent Application Publication No. 9-190693 discloses a technique for preventing a feedthrough current from flowing in a circuit to be connected with a data line even in a case where the potential of the data line is to be equalized in advance to an intermediate potential in the semiconductor memory device.

In recent years, the power consumption due to a signal line of a long wiring length (e.g., a signal line of a large load) such as an inter-block signal line has largely accounted for the total power consumption of the semiconductor integrated circuit. For realizing the low power consumption of the semiconductor integrated circuit, therefore, it is essential to reduce the power consumption due to the signal line of a large load.

SUMMARY OF THE INVENTION

It is an object of the invention to realize a semiconductor integrated circuit with a less power consumption by reducing a power consumption due to a signal line of a large load.

In a first aspect of the invention, a semiconductor integrated circuit is configured to include a signal line, and a driver circuit. The driver circuit drives the signal line in accordance with the input signal. The driver circuit is configured to include a first p-type transistor and a first n-type transistor. The first p-type transistor has a source connected with the signal line. The first p-type transistor has a drain connected with a low power supply line. The first p-type transistor has a gate receiving the input signal. The first n-type transistor has a source connected with the signal line. The first n-type transistor has a drain connected with a high power supply line. The first n-type transistor has a gate receiving the input signal.

Since the driver circuit driving the signal line is provided with the first p-type transistor and the second n-type transistor, the amplitude of the signal to be transmitted via the signal line can be reduced to an amplitude from a potential higher than the potential of the low power supply line by an absolute value of a threshold voltage of the first p-type transistor to a potential lower than the potential of the high power supply line by a threshold voltage of the first n-type transistor. As a result, it is possible to reduce the power consumption due to the signal line. This can greatly contribute to reduction of power consumption of the semiconductor integrated circuit, in case that a load of the signal line to be driven by the driver circuit is large.

In a second aspect of the invention, a semiconductor integrated circuit is configured to include a signal line and a driver circuit. The driver circuit receives a pulse signal of a negative logic as an input signal and drives the signal line in accordance with the input signal.

The driver circuit is configured to include a first p-type transistor and a second p-type transistor. The first p-type transistor has a source connected with the signal line. The first p-type transistor has a drain connected with a low power supply line. The first p-type transistor has a gate receiving the input signal. The second p-type transistor has a source connected with a high power supply line. The second p-type transistor has a drain connected with the signal line. The second p-type transistor has a gate receiving an inverted signal of the input signal.

The driver circuit driving the signal line is provided with the first p-type transistor and the second p-type transistor, so that the amplitude of the signal to be transmitted via the signal line can be reduced to an amplitude from a potential higher than the potential of the low power supply line by an absolute value of a threshold voltage of the first p-type transistor to the potential of the high power supply line. As a result, it is possible to reduce the power consumption due to the signal line. This can greatly contribute to reduction of power consumption of the semiconductor integrated circuit, in case that a load of the signal line to be driven by the driver circuit is large.

In a third aspect of the invention, a semiconductor integrated circuit is constituted to include a positive-phase side signal line, a negative-phase side signal line, a positive-phase side driver circuit, a negative-phase side driver circuit, a positive-phase side receiver circuit, a negative-phase side receiver circuit and a state transition circuit. The positive-phase side driver circuit receives a positive-phase pulse signal of a negative logic as an input signal, and drives the positive-phase side signal line in accordance with the input signal. The negative-phase side driver circuit receives a negative-phase pulse signal of a negative logic as an input signal, and drives the negative-phase side signal line in accordance with the input signal. The positive-phase side receiver circuit sets an output signal at a potential of a low power supply line, when a potential of the positive-phase side signal line is higher than a threshold value, and sets the output signal at a potential of a high power supply line when the potential of the positive-phase side signal line is lower than the threshold value. The negative-phase side receiver circuit sets an output signal at the potential of the low power supply line when a potential of the negative-phase side signal line is higher than a threshold value, and sets the output signal at the potential of the high power supply line when the potential of the negative-phase side signal line is lower than the threshold value. The state transition circuit transits from a first operation state to a second operation state in response to a rising transition of the output signal of the positive-phase side receiver circuit, and transits from the second operation state to the first operation state in response to a rising transition of the output signal of the negative-phase side receiver circuit. The positive-phase side driver circuit is configured to include a positive-phase side first p-type transistor and a positive-phase side second p-type transistor. The positive-phase side first p-type transistor has a source connected with the positive-phase side signal line. The positive-phase side first p-type transistor has a drain connected with the low power supply line. The positive-phase side first p-type transistor has a gate receiving an input signal (e.g., a positive-phase pulse signal). The positive-phase side second p-type transistor has a source connected with the high power supply line. The positive-phase side second p-type transistor has a drain connected with the positive-phase side signal line. The positive-phase side second p-type transistor has a gate receiving an inverted signal of the input signal. The negative-phase side driver circuit is configured to include a negative-phase side first p-type transistor and a negative-phase side second p-type transistor. The negative-phase side first p-type transistor has a source connected with the negative-phase side signal line. The negative-phase side first p-type transistor has a drain connected with the low power supply line. The negative-phase side first p-type transistor has a gate receiving an input signal (e.g., a negative-phase pulse signal). The negative-phase side second p-type transistor has a source connected with the high power supply line. The negative-phase side second p-type transistor has a drain connected with the negative-phase side signal line. The negative-phase side second p-type transistor has a gate receiving an inverted signal of the input signal.

Since the positive-phase side driver circuit driving the positive-phase side signal line is provided with the positive-phase side first p-type transistor and the positive-phase side second p-type transistor, the amplitude of the signal to be transmitted via the positive-phase side signal line can be reduced to an amplitude from a potential higher than the potential of the low power supply line by an absolute value of a threshold voltage of the positive-phase side first p-type transistor to the potential of the high power supply line. Similarly, the negative-phase side driver circuit driving the negative-phase side signal line is provided with the negative-phase side first p-type transistor and the negative-phase side second p-type transistor, the amplitude of the signal to be transmitted via the negative-phase side signal line can be reduced to an amplitude from a potential higher than the potential of the low power supply line by an absolute value of a threshold voltage of the negative-phase side first p-type transistor to the potential of the high power supply line. As a result, it is possible to reduce the power consumption due to the positive-phase side signal line and the negative-phase side signal line. This can greatly contribute to reduction of the power consumption of the semiconductor integrated circuit, in case that loads of the positive-phase side signal line and the negative-phase side signal line to be driven by the positive-phase side driver circuit and the negative-phase side driver circuit respectively are large.

In a fourth aspect of the invention, a semiconductor integrated circuit is configured to include a signal line, and a driver circuit. The driver circuit receives a pulse signal of a positive logic as an input signal and drives the signal line in accordance with the input signal. The driver circuit is configured to include a first n-type transistor and a second n-type transistor. The first n-type transistor has a source connected with the signal line. The first n-type transistor has a drain connected with a high power supply line. The first n-type transistor has a gate receiving the input signal. The second n-type transistor has a source connected with a low power supply line. The second n-type transistor has a drain connected with the signal line. The second n-type transistor has a gate receiving an inverted signal of the input signal.

Since the driver circuit driving the signal line is provided with the first n-type transistor and the second n-type transistor, the amplitude of the signal to be transmitted via the signal line can be reduced to an amplitude from the potential of the low power supply line to a potential lower than the potential of the high power supply line by a threshold voltage of the first n-type transistor. As a result, it is possible to reduce the power consumption due to the signal line. This can greatly contribute to reduction of the power consumption of the semiconductor integrated circuit, in case that a load of the signal line to be driven by the driver circuit is large.

In a fifth aspect of the invention, a semiconductor integrated circuit is constituted to include a positive-phase side signal line, a negative-phase side signal line, a positive-phase side driver circuit, a negative-phase side driver circuit, a positive-phase side receiver circuit, a negative-phase side receiver circuit and a state transition circuit. The positive-phase side driver circuit receives a positive-phase pulse signal of a positive logic as an input signal, and drives the positive-phase side signal line in accordance with the input signal. The negative-phase side driver circuit receives a negative-phase pulse signal of a positive logic as an input signal, and drives the negative-phase side signal line in accordance with the input signal. The positive-phase side receiver circuit sets an output signal at a potential of a low power supply line when a potential of the positive-phase side signal line is higher than a threshold value, and sets the output signal at a potential of a high power supply line when the potential of the positive-phase side signal line is lower than the threshold value. The negative-phase side receiver circuit sets an output signal at the potential of the low power supply line when a potential of the negative-phase side signal line is higher than a threshold value, and sets the output signal at the potential of the high power supply line when the potential of the negative-phase side signal line is lower than the threshold value. The state transition circuit transits from a first operation state to a second operation state in response to a falling transition of the output signal of the positive-phase side receiver circuit, and transits from the second operation state to the first operation state in response to a falling transition of the output signal of the negative-phase side receiver circuit. The positive-phase side driver circuit is configured to include a positive-phase side first n-type transistor and a positive-phase side second n-type transistor. The positive-phase side first n-type transistor has a source connected with the positive-phase side signal line. The positive-phase side first n-type transistor has a drain connected with the high power supply line. The positive-phase side first n-type transistor has a gate receiving an input signal (e.g., a positive-phase pulse signal). The positive-phase side second n-type transistor has a source connected with the low power supply line. The positive-phase side second n-type transistor has a drain connected with the positive-phase side signal line. The positive-phase side second n-type transistor has a gate receiving an inverted signal of the input signal. The negative-phase side driver circuit is configured to include a negative-phase side first n-type transistor and a negative-phase side second n-type transistor. The negative-phase side first n-type transistor has a source connected with the negative-phase side signal line. The negative-phase side first n-type transistor has a drain connected with the high power supply line. The negative-phase side first p-type transistor has a gate receiving an input signal (e.g., a negative-phase pulse signal). The negative-phase side second n-type transistor has a source connected with the low power supply line. The negative-phase side second n-type transistor has a drain connected with the negative-phase side signal line. The negative-phase side second n-type transistor has a gate receiving an inverted signal of the input signal.

Since the positive-phase side driver circuit driving the positive-phase side signal line is provided with the positive-phase side first n-type transistor and the positive-phase side second n-type transistor, the amplitude of the signal to be transmitted via the positive-phase side signal line can be reduced to an amplitude from a potential of the low power supply line to a potential lower than the potential of the high power supply line by a threshold voltage of the positive-phase side first n-type transistor. Similarly, the negative-phase side driver circuit driving the negative-phase side signal line is provided with the negative-phase side first n-type transistor and the negative-phase side second n-type transistor, so that the amplitude of the signal to be transmitted via the negative-phase side signal line can be reduced to an amplitude from the potential of the low power supply line to the potential lower by a threshold voltage of the negative-phase side first n-type transistor than the potential of the high power supply line. As a result, it is possible to reduce the power consumption due to the positive-phase side signal line and the negative-phase side signal line. This can greatly contribute to reduction of the power consumption of the semiconductor integrated circuit, in case that loads of the positive-phase side signal line and the negative-phase side signal line to be driven by the positive-phase side driver circuit and the negative-phase side driver circuit respectively are large.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
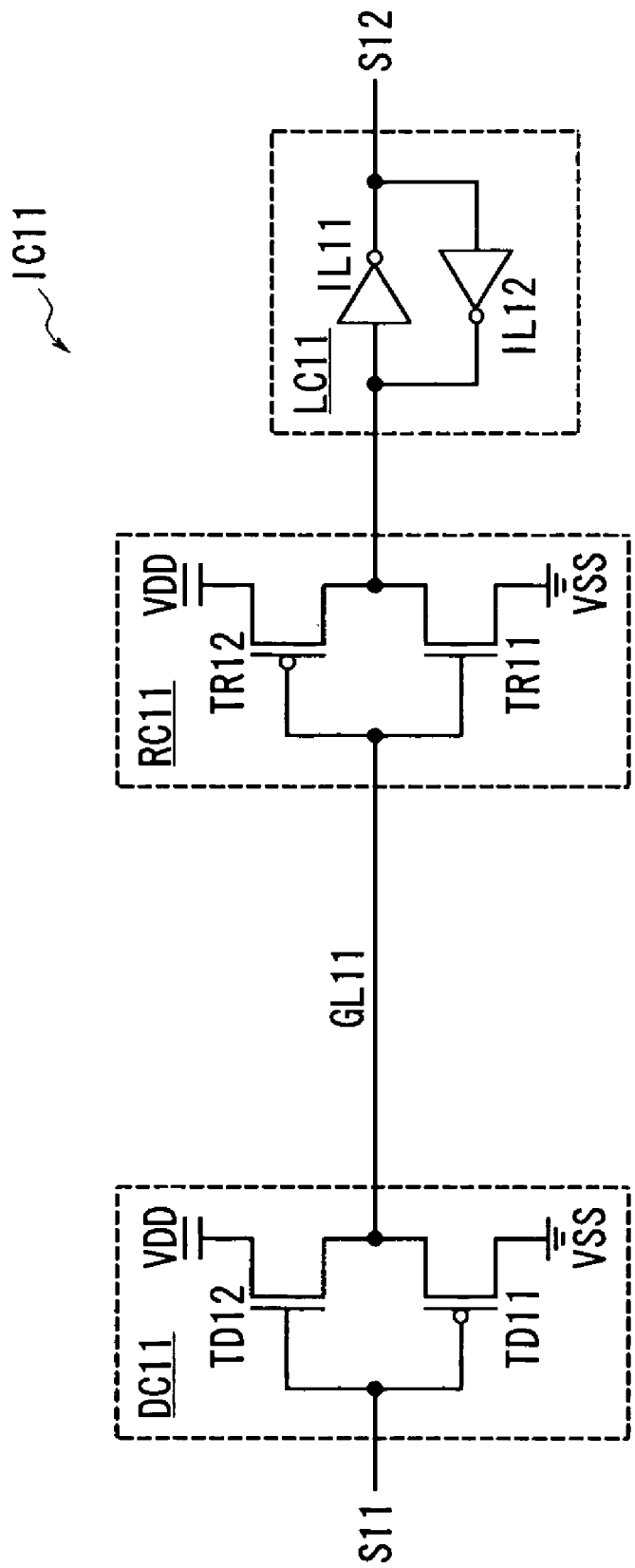
FIG. 1 is an explanatory diagram showing a first embodiment of the invention.

Embodiments of the invention are described with reference to the accompanying drawings. FIG. 1 shows a first embodiment of the invention. A semiconductor integrated circuit IC11 includes: a signal line GL11; a driver circuit DC11 for driving the signal line GL11 in accordance with an input signal S11; a receiver circuit RC11 for generating an output signal in accordance with the potential of the signal line GL11; and a latch circuit LC11 for latching the output signal of the receiver circuit RC11 to generate an output signal S12. For example, the driver circuit DC11 and the receiver circuit RC11 are disposed in different circuit blocks arranged at a spacing. The latch circuit LC11 is disposed in the same circuit block as that of the receiver circuit RC11. The signal line GL11 is the so-called global signal line (e.g., an inter-block signal line) and has a large load.

The driver circuit DC11 includes a pMOS transistor TD11 (e.g., a first p-type transistor) and an nMOS transistor TD12 (e.g., a first n-type transistor). The pMOS transistor TD11 has its source connected with the signal line GL11. The pMOS transistor TD11 has its drain connected with a ground line VSS (e.g., a low power supply line). The gate of the pMOS transistor TD11 receives the input signal S11. The nMOS transistor TD12 has its source connected with the signal line GL11. The nMOS transistor TD12 has its drain connected with a power supply line VDD (e.g., a high power supply line). The gate of the nMOS transistor TD12 receives the input signal S11. The input signal S11 is a level signal fed from a circuit disposed in the same circuit block as that of the driver circuit DC11, for example, and has an amplitude from a ground potential VSS (e.g., the potential of the ground line VSS) to a power supply potential VDD (e.g., the potential of the power supply line VDD).

The receiver circuit RC11 includes an nMOS transistor TR11 and a pMOS transistor TR12. The nMOS transistor TR11 has its source connected with the ground line VSS. The drain of the nMOS transistor TR11 and the drain of the pMOS transistor TR12 are connected with each other. The pMOS transistor TR12 has its source connected with the power supply line VDD. The gate of the nMOS transistor TR11 and the gate of the pMOS transistor TR12 are connected with the signal line GL11. Thus, the receiver circuit RC11 is an inverter configured to include the nMOS transistor TR11 and the pMOS transistor TR12. The receiver circuit RC11 sets the output signal (e.g., the signal to be generated at a connection node between the nMOS transistor TR11 and the pMOS transistor TR12) at the ground potential VSS, when the potential of the signal line GL11 is higher than a threshold value (e.g., about one half of the power supply potential VDD), and at the power supply potential VDD when the potential of the signal line GL11 is lower than the threshold value.

The latch circuit LC11 includes inverters IL11 and IL12 connected in a ring shape. The connection node between the input terminal of the inverter IL11 and the output terminal of the inverter IL12 is connected with the output node (e.g., the connection node between the nMOS transistor TR11 and the pMOS transistor TR12) of the receiver circuit RC11. The output signal S12 of the latch circuit LC11 is a signal generated at the connection node between the output terminal of the inverter IL11 and the input terminal of the inverter IL12.

Figure 2:
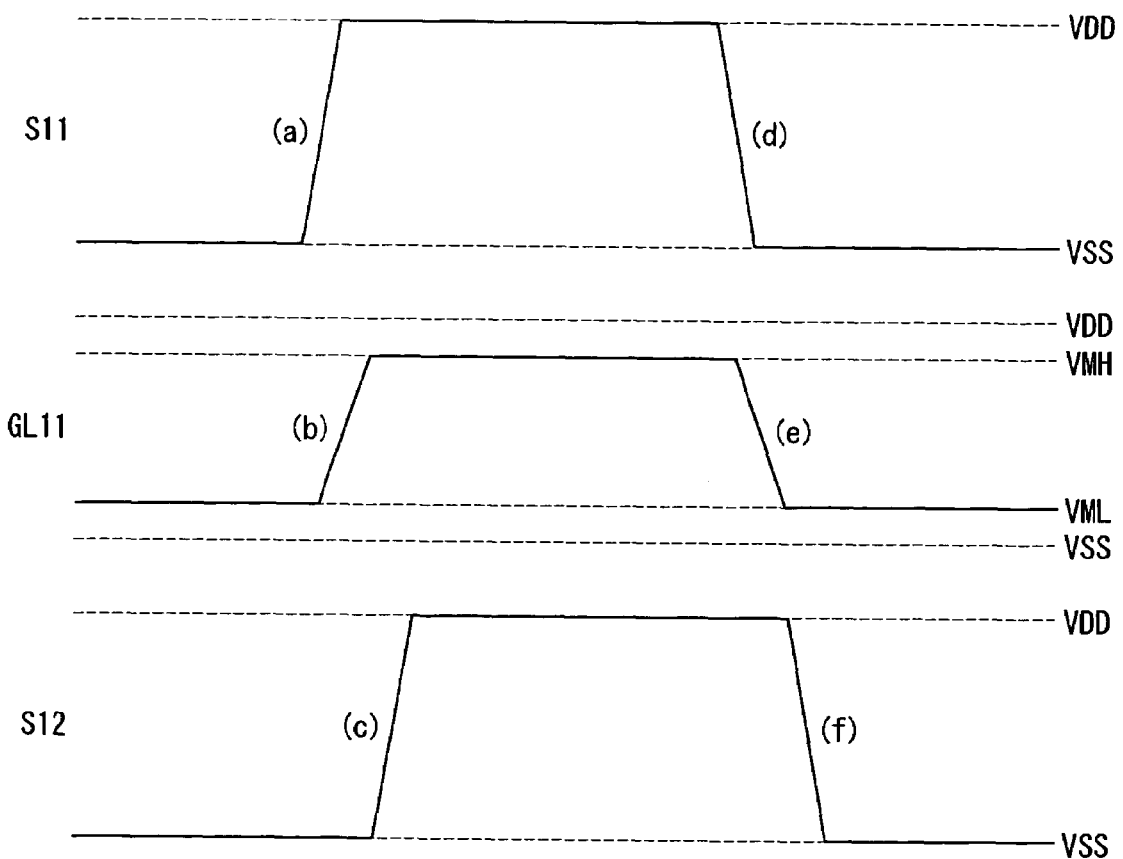
FIG. 2 is an explanatory diagram showing operation waveforms of the first embodiment of the invention.

FIG. 2 shows operation waveforms of the first embodiment of the invention. The pMOS transistor TD11 is turned ON when the gate-to-source voltage becomes lower than the threshold voltage Vthp, and OFF when the gate-to-source voltage becomes higher than the threshold voltage Vthp. The nMOS transistor TD12 is turned ON when the gate-to-source voltage becomes higher than a threshold voltage Vthn, and ON when the gate-to-source voltage is lower than the threshold voltage Vthn. When the input signal S11 transits from the ground potential VSS to the power supply potential VDD (FIG. 2(a)), therefore, only the nMOS transistor TD12 is turned ON to raise the potential of the signal line GL11 (FIG. 2(b)). When the potential of the signal line GL11 is raised to an intermediate potential VMH (VDD−Vthn), the nMOS transistor TD12 is turned OFF. When the potential of the signal line GL11 becomes higher than the threshold value of the receiver circuit RC11, moreover, the output signal of the receiver circuit RC11 transits from the power supply potential VDD to the ground potential VSS so that the output signal S12 of the latch circuit LC11 transits from the ground potential VSS to the power supply potential VDD (FIG. 2(c)).

When the input signal S11 then transits from the power supply potential VDD to the ground potential VSS (FIG. 2(d)), only the pMOS transistor TD11 is turned ON to lower the potential of the signal line GL11 (FIG. 2(e)). When the potential of the signal line GL11 is lowered to an intermediate potential VML (VSS+|Vthp|), the pMOS transistor TD11 is turned OFF. When the potential of the signal line GL11 becomes lower than the threshold value of the receiver circuit RC11, on the other hand, the output signal of the receiver circuit RC11 transits from the ground potential VSS to the power supply potential VDD so that the output signal S12 of the latch circuit LC11 transits from the power supply potential VDD to the ground potential VSS (FIG. 2(f)).

Thus, the semiconductor integrated circuit IC11 can reduce the amplitude of the signal to be transmitted via the signal line GL11 of the large load, to an amplitude from the intermediate potential VML to the intermediate potential VMH. As a result, the power consumption due to the signal line GL11 of the large load can be reduced to make a high contribution to the low power consumption of the semiconductor integrated circuit IC11.

Figure 3:
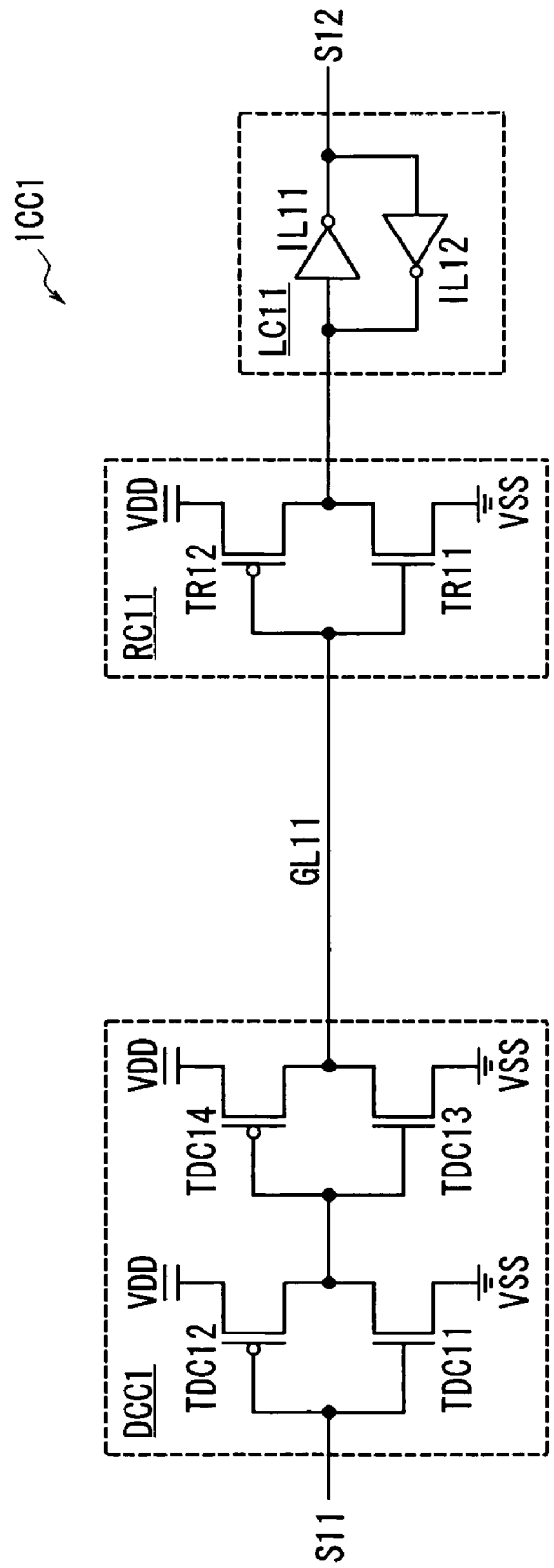
FIG. 3 is an explanatory diagram showing a first comparison of the invention.

FIG. 3 shows a first comparison of the invention. For the description of the first comparison, the same components as those described in connection with the first embodiment are omitted in their detail description by designating them by the common reference numerals. A semiconductor integrated circuit ICC1 is configured with a driver circuit DCC1 instead of the driver circuit DC11 of the semiconductor integrated circuit IC11 (FIG. 1).

The driver circuit DCC1 includes nMOS transistors TDC11 and TDC13 and pMOS transistors TDC12 and TDC14. The nMOS transistor TDC11 has its source connected with the ground line VSS. The drain of the nMOS transistor TDC11 and the drain of the pMOS transistor TDC12 are connected with each other. The pMOS transistor TDC12 has its source connected with the power supply line VDD. The gate of the nMOS transistor TDC11 and the gate of the pMOS transistor TDC12 receive the input signal S11. The nMOS transistor TDC13 has its source connected with the ground line VSS. The drain of the nMOS transistor TDC13 and the drain of the pMOS transistor TDC14 are connected with the signal line GL11. The pMOS transistor TDC14 has its source connected with the power supply line VDD. The gate of the nMOS transistor TDC13 and the gate of the pMOS transistor TDC14 are connected with the connection node between the nMOS transistor TDC11 and the pMOS transistor TDC12. Specifically, the driver circuit DCC1 is configured by serially connecting the inverter composed of the nMOS transistor TDC11 and the pMOS transistor TDC12 and the inverter composed of the nMOS transistor TDC13 and the pMOS transistor TDC14.

In the semiconductor integrated circuit ICC1 thus configured, the amplitude of the signal to be transmitted via the signal line GL11 is an amplitude from the ground potential VSS to the power supply potential VDD. Therefore, the semiconductor integrated circuit ICC1 has a more power consumption due to the signal line GL11 of the large load than that of the semiconductor integrated circuit IC11.

Figure 4:
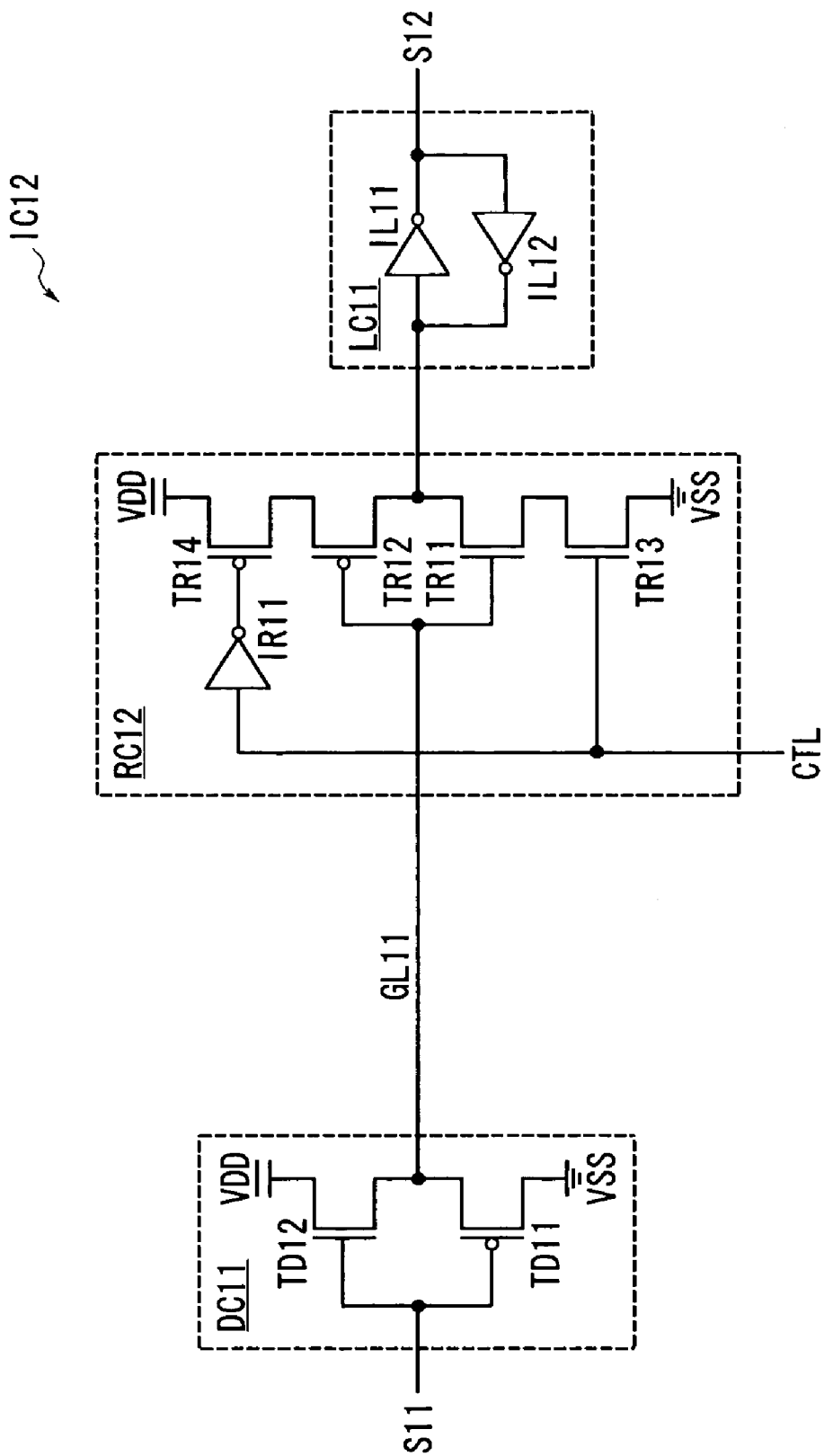
FIG. 4 is an explanatory diagram showing a second embodiment of the invention.

FIG. 4 shows a second embodiment of the invention. For the description of the second embodiment, the same components as those described in connection with the first embodiment are omitted in their detail description by designating them by the common reference numerals. A semiconductor integrated circuit IC12 is configured with a receiver circuit RC12 instead of the receiver circuit RC11 of the semiconductor integrated circuit IC11 (FIG. 1). The receiver circuit RC12 is configured by adding an nMOS transistor TR13, a pMOS transistor TR14 (e.g. a cut-off circuit) and an inverter IR11 to the receiver circuit RC11.

The nMOS transistor TR13 has its source connected with the ground line VSS. The nMOS transistor TR13 has its drain connected with the source of the nMOS transistor TR11. The gate of the nMOS transistor TR13 receives a control signal CTL. The pMOS transistor TR14 has its source connected with the power supply line VDD. The pMOS transistor TR14 has its drain connected with the source of the pMOS transistor TR12. The gate of the pMOS transistor TR14 receives the control signal CTL through the inverter IR11. In other words, the gate of the pMOS transistor TR14 receives the inverted signal of the control signal CTL.

The control signal CTL is a signal for instructing the permission/prohibition of the receiving operation of the receiver circuit RC12 and is fed, for example, from the (not-shown) control circuit for controlling the entirety of the semiconductor integrated circuit IC12. The control signal CTL is set at the power supply potential VDD, when the operation of the receiver circuit RC12 is permitted, and at the ground potential VSS when the operation of the receiver circuit RC12 is prohibited. As a result, the nMOS transistor TR13 and the pMOS transistor TR14 are turned ON in response to the rising transition (e.g., the operation start request) of the control signal CTL and OFF in response to the falling transition (e.g., the operation stop request) of the control signal CTL.

Figure 5:
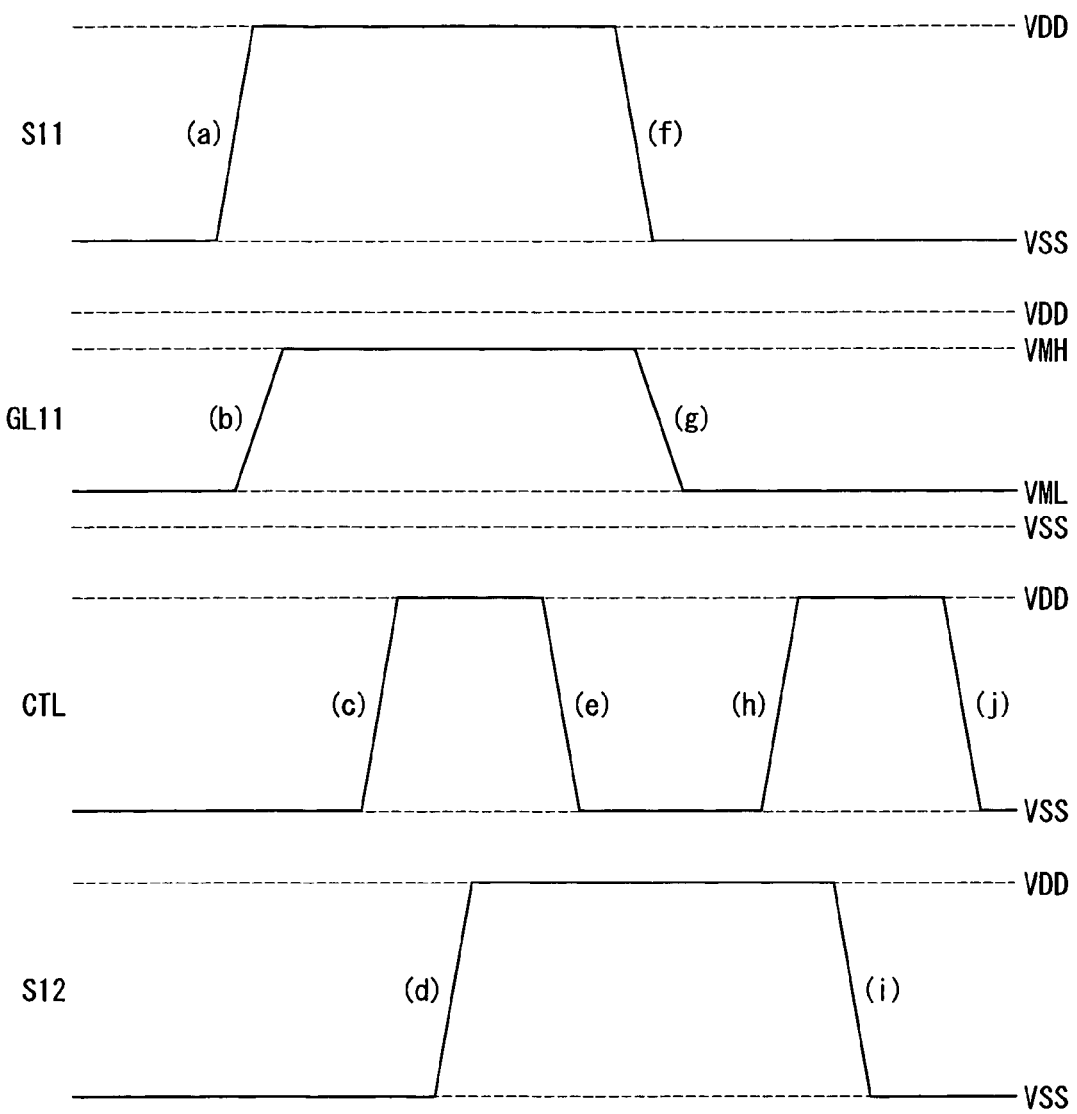
FIG. 5 is an explanatory diagram showing operation waveforms of the second embodiment of the invention.

FIG. 5 shows the operation waveforms of the second embodiment of the invention. When the input signal S11 transits from the ground potential VSS to the power supply potential VDD (FIG. 5(a)), only the nMOS transistor TD12 is turned ON to raise the potential of the signal line GL11 (FIG. 5(b)). When the potential of the signal line GL11 is raised to the intermediate potential VMH, the nMOS transistor TD12 is turned OFF. When the control signal CTL transits in this state from the ground potential VSS to the power supply potential VDD (FIG. 5(c)), the nMOS transistor TR13 and the pMOS transistor TR14 are turned ON so that the output signal of the receiver circuit RC12 transits from the power supply potential VDD to the ground potential VSS. As a result, the output signal S12 of the latch circuit LC11 transits from the ground potential VSS to the power supply potential VDD (FIG. 5(d)). When the control signal CTL transits from the power supply potential VDD to the ground potential VSS (FIG. 5(e)), the nMOS transistor TR13 and the pMOS transistor TR14 are turned OFF.

When the input signal S11 then transits from the power supply potential VDD to the ground potential VSS (FIG. 5(f)), only the pMOS transistor TD1 is turned ON to lower the potential of the signal line GL11 (FIG. 5(g)). When the potential of the signal line GL11 is lowered to the intermediate potential VML, the pMOS transistor TD11 is turned OFF. When the control signal CTL transits in this state from the ground potential VSS to the power supply potential VDD (FIG. 5(h)), the nMOS transistor TR13 and the pMOS transistor TR14 are turned ON so that the output signal of the receiver circuit RC12 transits from the ground potential VSS to the power supply potential VDD. As a result, the output signal S12 of the latch circuit LC11 transits from the power supply potential VDD to the ground potential VSS (FIG. 5(i)). When the control signal CTL transits from the power supply potential VDD to the ground potential VSS (FIG. 5(j)), the nMOS transistor TR13 and the pMOS transistor TR14 are turned OFF.

When the rising transition of the control signal CTL thus occurs in the semiconductor integrated circuit IC12 so as to stop the operation of the receiver circuit RC12, the nMOS transistor TR13 and the pMOS transistor TR14 are turned OFF in the receiver circuit RC12. As a result, the potential supply from the ground line VSS to the nMOS transistor TR11 is cut off, and the potential supply from the power supply line VDD to the pMOS transistor TR12 is cut off. Therefore, it is possible to suppress the feedthrough current which is generated as a result that the signal to be transmitted via the signal line GL11 is set at the intermediate potential VML or VMH.

Figure 6:
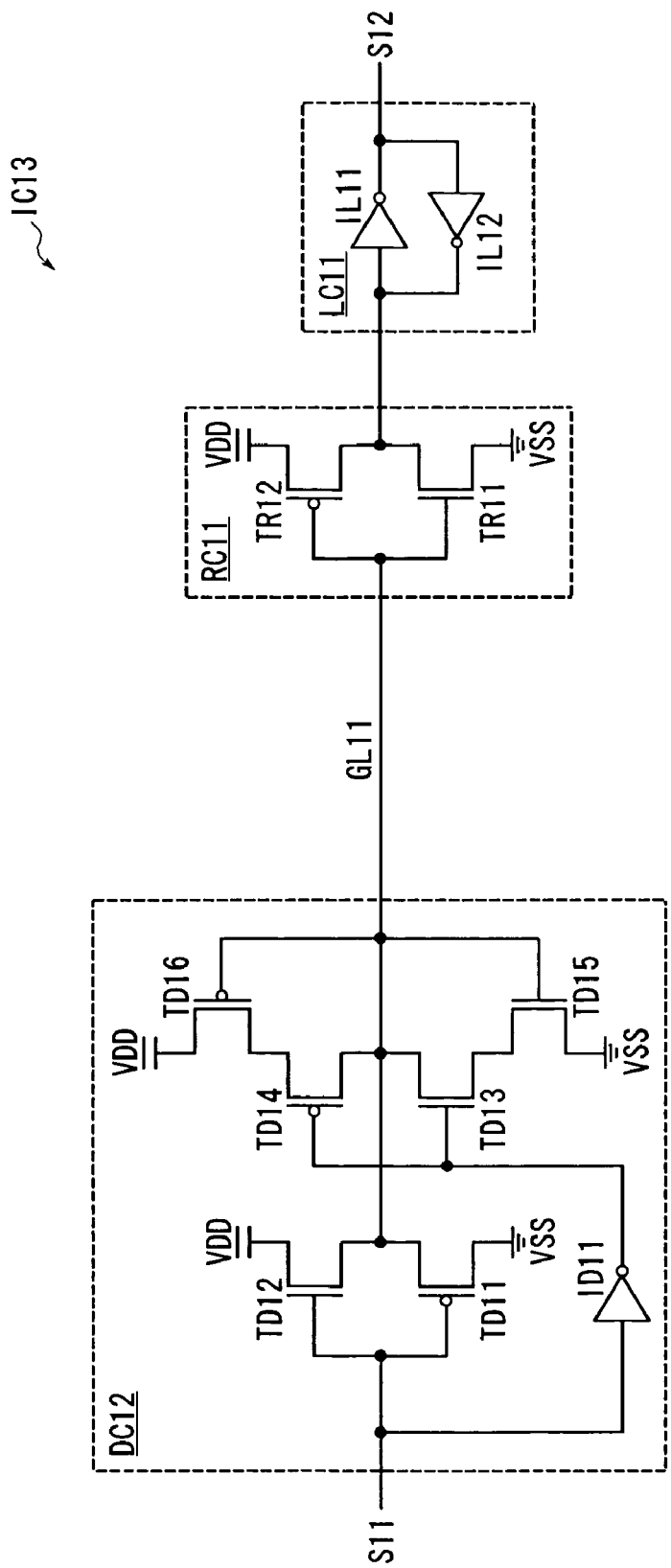
FIG. 6 is an explanatory diagram showing a third embodiment of the invention.

FIG. 6 shows a third embodiment of the invention. For the description of the third embodiment, the same components as those described in connection with the first embodiment are omitted in their detail description by designating them by the common reference numerals. A semiconductor integrated circuit IC13 is configured with a driver circuit DC12 instead of the driver circuit DC11 of the semiconductor integrated circuit IC11 (FIG. 1). The driver circuit DC12 is configured by adding an nMOS transistor TD13 (e.g., a second n-type transistor), a pMOS transistor TD14 (e.g., a second p-type transistor), an nMOS transistor TD15 (e.g., a first switch circuit) and a pMOS transistor TD16 (e.g., a second switch circuit) to the driver circuit DC11.

The nMOS transistor TD13 has its drain connected with the signal line GL11. The source of the nMOS transistor TD13 and the drain of the nMOS transistor TD15 are connected with each other. The nMOS transistor TD15 has its source connected with the ground line VSS. The pMOS transistor TD14 has its drain connected with the signal line GL11. The source of the pMOS transistor TD14 and the drain of the pMOS transistor TD16 are connected with each other. The pMOS transistor TD16 has its source connected with the power supply line VDD. The gate of the nMOS transistor TD13 and the gate of the pMOS transistor TD14 receive the input signal S11 through an inverter ID11. In other words, the gate of the nMOS transistor TD13 and the gate of the pMOS transistor TD14 receive the inverted signal of the input signal S11. The gate of the nMOS transistor TD15 and the gate of the pMOS transistor TD16 are connected with the signal line GL11.

In the semiconductor integrated circuit IC13 thus configured, when the signal line GL11 is set at the intermediate potential VMH, the nMOS transistor TD15 is ON, but the pMOS transistor TD16 is OFF. When the falling transition of the input signal S11 occurs in this state, not only the pMOS transistor TD11 but also the nMOS transistor TD13 is turned ON. This shortens the time period necessary for the falling transition of the signal to be transmitted via the signal line GL11. As the potential of the signal line GL11 becomes lower than the threshold value of the receiver circuit RC11, the nMOS transistor TD15 is turned OFF, but the pMOS transistor TD16 is turned ON.

When the signal line GL11 is set at the intermediate potential VML, on the other hand, the nMOS transistor TD15 is OFF, but the pMOS transistor TD16 is ON. When the rising transition of the input signal S11 occurs in this state, not only the nMOS transistor TD12 but also the pMOS transistor TD14 is turned ON. This shortens the time period necessary for the rising transition of the signal to be transmitted via the signal line GL11. As the potential of the signal line GL11 becomes higher the threshold value of the receiver circuit RC11, the nMOS transistor TD15 is turned ON, but the pMOS transistor TD16 is turned OFF.

Thus, not only the pMOS transistor TD11 but also the nMOS transistor TD13 is turned ON when the potential of the signal line GL11 is lowered, and not only the nMOS transistor TD12 but also the pMOS transistor TD14 is turned ON when the potential of the signal line GL11 is raised. This makes it possible to speed up the signal transmissions via the signal line GL11. Moreover, the nMOS transistor TD15 is turned OFF, when the drive of the signal line GL11 by the nMOS transistor TD13 becomes unnecessary, and the pMOS transistor TD16 is turned OFF when the drive of the signal line GL11 by the pMOS transistor TD14 becomes unnecessary. This makes it possible to avoid the excessive potential supply from the ground line VSS and the power supply line VDD to the signal line GL11.

Figure 7:
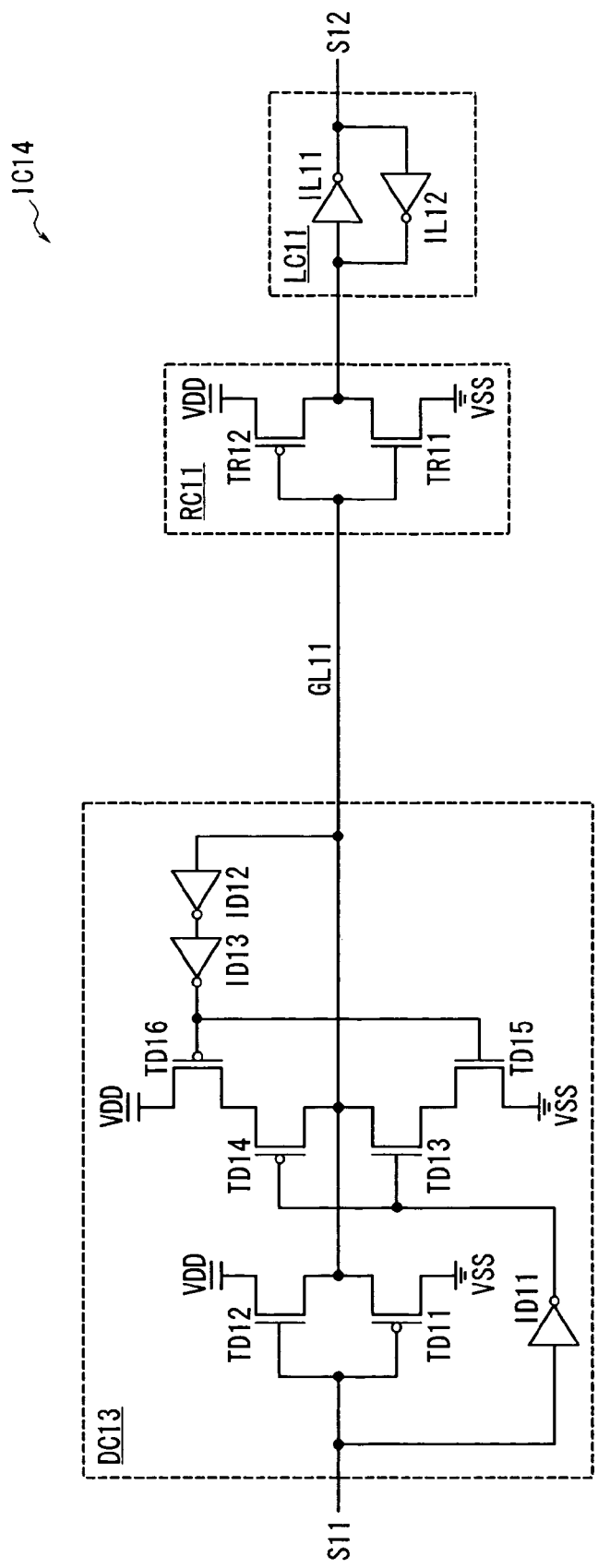
FIG. 7 is an explanatory diagram showing a fourth embodiment of the invention.

FIG. 7 shows a fourth embodiment of the invention. For the description of the fourth embodiment, the same components as those described in connection with the first and third embodiments are omitted in their detail description by designating them by the common reference numerals. A semiconductor integrated circuit IC14 is configured with a driver circuit DC13 instead of the driver circuit DC12 of the semiconductor integrated circuit IC13 (FIG. 6). The driver circuit DC13 is configured by adding an inverter ID12 (e.g., a detection circuit) and an inverter ID13 to the driver circuit DC12.

The inverter ID12 has its input terminal connected with the signal line GL11. The output terminal of the inverter ID12 and the input terminal of the inverter ID13 are connected with each other. The output terminal of the inverter ID13 is connected with the gate of the nMOS transistor TD15 and the gate of the pMOS transistor TD16.

In the semiconductor integrated circuit IC14 thus configured, the inverter ID12 has the same circuit configuration as that of the receiver circuit RC11 so that the rising transition and the falling transition occur at a substantially identical timing in the output signal of the inverter ID12 and the output signal of the receiver circuit RC11. By controlling the ON/OFF of the nMOS transistor TD15 and the pMOS transistor TD16 individually with the output signal of the inverter ID13 (e.g., the inverted signal of the output signal of the inverter ID12), therefore, the nMOS transistor TD15 can be turned OFF simultaneously as the drive of the signal line GL11 by the nMOS transistor TD13 becomes unnecessary, and the pMOS transistor TD16 can be turned OFF simultaneously as the drive of the signal line GL11 by the pMOS transistor TD14 becomes unnecessary. As a result, it is possible to reliably avoid an excessive potential supply from the ground line VSS and the power supply line VDD to the signal line GL11.

Figure 8:
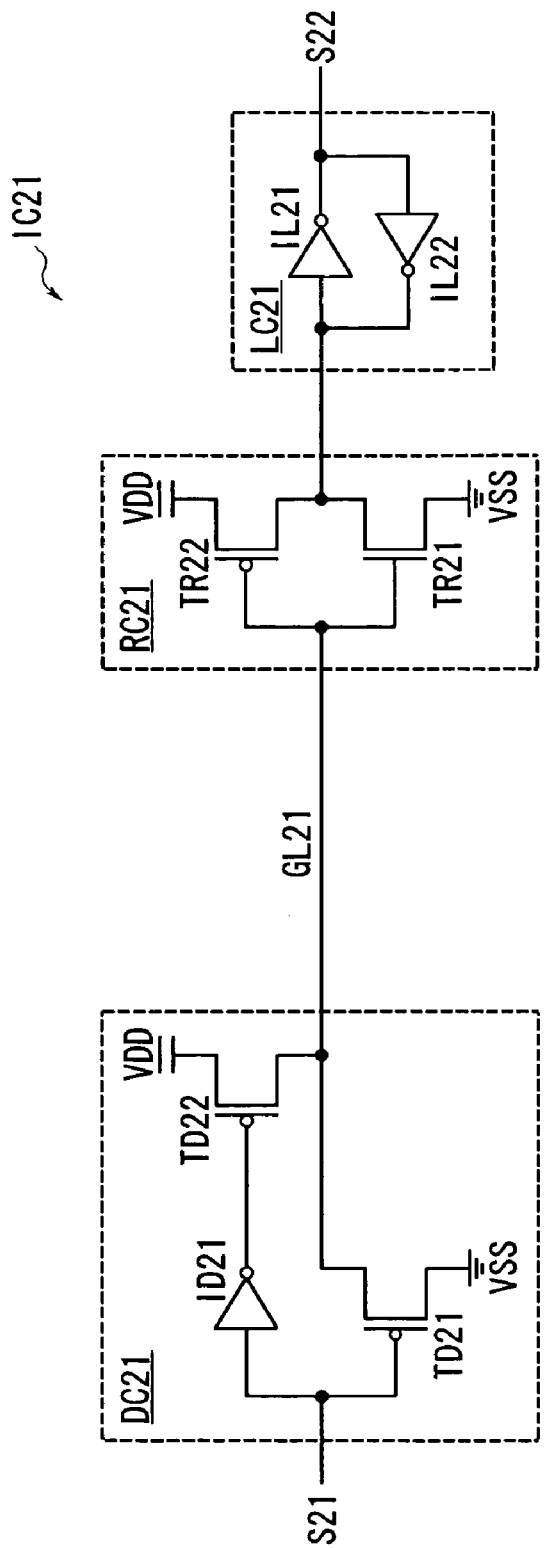
FIG. 8 is an explanatory diagram showing a fifth embodiment of the invention.

FIG. 8 shows a fifth embodiment of the invention. A semiconductor integrated circuit IC21 is configured to include: a signal line GL21; a driver circuit DC21 for driving the signal line GL21 in accordance with an input signal S21; a receiver circuit RC21 for generating an output signal in accordance with the potential of the signal line GL21; and a latch circuit LC21 for latching the output signal of the receiver circuit RC21 to generate an output signal S22. For example, the driver circuit DC21 and the receiver circuit RC21 are disposed in different circuit blocks arranged at a spacing. The latch circuit LC21 is disposed in the same circuit block as that of the receiver circuit RC21. The signal line GL21 is a global signal line of a large load.

The driver circuit DC21 is configured to include a pMOS transistor TD21 (e.g., a first p-type transistor), a pMOS transistor TD22 (e.g., a second p-type transistor) and an inverter ID21. The pMOS transistor TD21 has its source connected with the signal line GL21. The pMOS transistor TD21 has its drain connected with the ground line VSS (e.g., a low power supply line). The gate of the pMOS transistor TD21 receives the input signal S21. The pMOS transistor TD22 has its source connected with the power supply line VDD (e.g., a high power supply line). The pMOS transistor TD22 has its drain connected with the signal line GL21. The gate of the pMOS transistor TD22 receives the input signal S21 through the inverter ID21. In other words, the gate of the pMOS transistor TD22 receives the inverted signal of the input signal S21. The input signal S21 is a pulse signal of a negative logic to be fed from a circuit disposed in the same circuit block as that of the driver circuit DC21, for example, and has an amplitude from the ground potential VSS (at an active level) to the power supply potential VDD (at an inactive level).

The receiver circuit RC21 includes an nMOS transistor TR21 and a pMOS transistor TR22. The nMOS transistor TR21 has its source connected with the ground line VSS. The drain of the nMOS transistor TR21 and the drain of the pMOS transistor TR22 are connected with each other. The pMOS transistor TR22 has its source connected with the power supply line VDD. The gate of the nMOS transistor TR21 and the gate of the pMOS transistor TR22 are connected with the signal line GL21. Thus, the receiver circuit RC21 is an inverter composed of the nMOS transistor TR21 and the pMOS transistor TR22, and sets the output signal (e.g., the signal to be generated at the connection node between the nMOS transistor TR21 and the pMOS transistor TR22) at the ground potential VSS, when the potential of the signal line GL21 is higher than a threshold value (e.g., about one half of the power supply potential VDD), and the output signal at the power supply potential VDD when the potential of the signal line GL21 is lower than the threshold value.

The latch circuit LC21 includes inverters IL21 and IL22 connected in a ring shape. The connection node between the input terminal of the inverter IL21 and the output terminal of the inverter IL22 is connected with the output node (e.g., the connection node between the nMOS transistor TR21 and the pMOS transistor TR22) of the receiver circuit RC21. The output signal S22 of the latch circuit LC21 is a signal generated at the connection node between the output terminal of the inverter IL21 and the input terminal of the inverter IL22.

Figure 9:
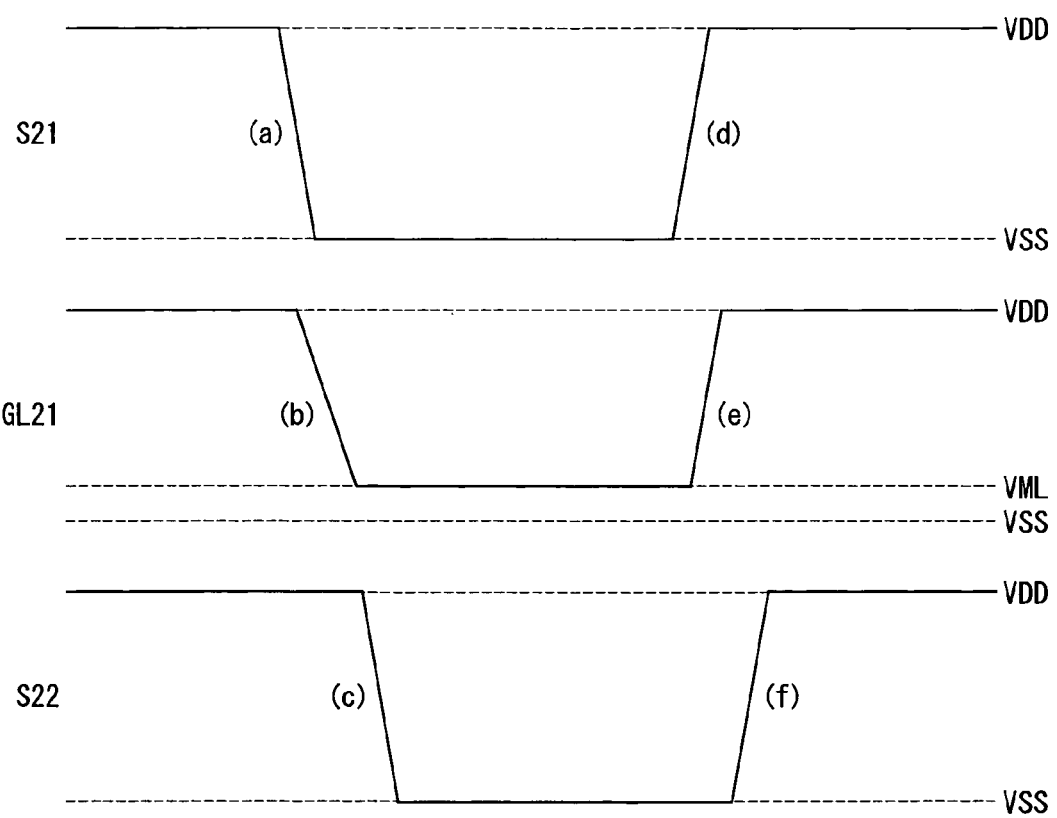
FIG. 9 is an explanatory diagram showing operation waveforms of the fifth embodiment of the invention.

FIG. 9 shows the operation waveforms of the fifth embodiment of the invention. The pMOS transistor TD21 is turned ON, when the gate-to-source voltage becomes lower than the threshold voltage Vthp, and OFF when the gate-to-source voltage becomes higher than the threshold voltage Vthp. When the input signal S21 transits from the power supply potential VDD to the ground potential VSS (FIG. 9(a)), therefore, the pMOS transistor TD21 is turned ON, but the pMOS transistor TD22 is turned OFF so that the potential of the signal line GL21 is lowered (FIG. 9(b)). When the potential of the signal line GL21 is lowered to the intermediate potential VML (VSS+|Vthp|), the pMOS transistor TD21 is turned OFF. When the potential of the signal line GL21 becomes lower than the threshold value of the receiver circuit RC21, on the other hand, the output signal of the receiver circuit RC21 transits from the ground potential VSS to the power supply potential VDD so that the output signal S22 of the latch circuit LC21 transits from the power supply potential VDD to the ground potential VSS (FIG. 9(c)).

When the input signal S21 then transits from the ground potential VSS to the power supply potential VDD (FIG. 9(d)), the pMOS transistor TD22 is turned ON so that the potential of the signal line GL21 is raised to the power supply potential VDD (FIG. 9(e)). When the potential of the signal line GL21 becomes higher than the threshold value of the receiver circuit RC21, on the other hand, the output signal of the receiver circuit RC21 transits from the power supply potential VDD to the ground potential VSS so that the output signal S22 of the latch circuit LC21 transits from the ground potential VSS to the power supply potential VDD (FIG. 9(f)).

Thus in the semiconductor integrated circuit IC21, the amplitude of the signal to be transmitted via the signal line GL21 of a large load can be reduced to an amplitude from the intermediate potential VML to the power supply potential VDD. As a result, the power consumption due to the signal line GL21 of the large load can be reduced to make a high contribution to the low power consumption of the semiconductor integrated circuit IC21.

Figure 10:
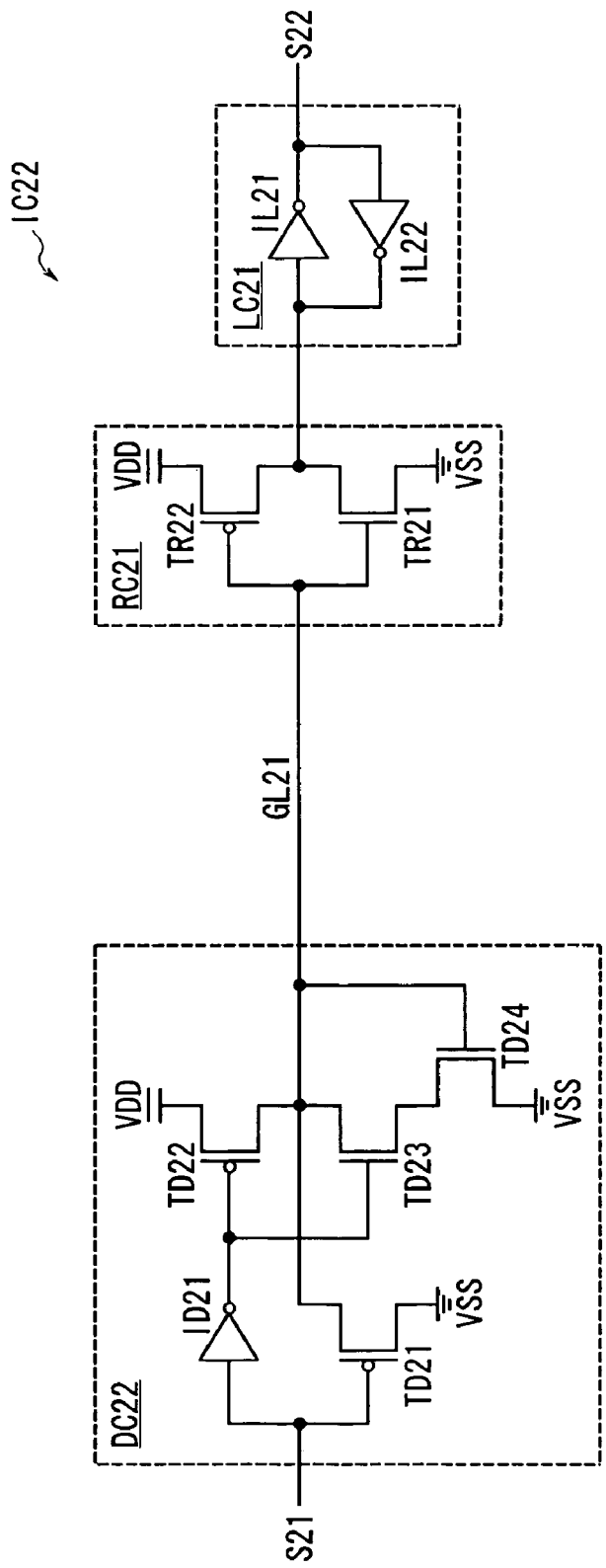
FIG. 10 is an explanatory diagram showing a sixth embodiment of the invention.

FIG. 10 shows a sixth embodiment of the invention. For the description of the sixth embodiment, the same components as those described in connection with the fifth embodiment are omitted in their detail description by designating them by the common reference numerals. A semiconductor integrated circuit IC22 is configured with a driver circuit DC22 instead of the driver circuit DC21 of the semiconductor integrated circuit IC21 (FIG. 8).

The driver circuit DC22 is configured by adding an nMOS transistor TD23 (e.g., an n-type transistor) and an nMOS transistor TD24 (e.g., a switch circuit) to the driver circuit DC21. The nMOS transistor TD23 has its drain connected with the signal line GL21. The source of the nMOS transistor TD23 and the drain of the nMOS transistor TD24 are connected with each other. The nMOS transistor TD24 has its source connected with the ground line VSS. The gate of the nMOS transistor TD23 receives the input signal S21 through the inverter ID21. In other words, the gate of the nMOS transistor TD23 receives the inverted signal of the input signal S21. The nMOS transistor TD24 has its gate connected with the signal line GL21.

In the semiconductor integrated circuit IC22 thus configured, the nMOS transistor TD24 is ON when the signal line GL21 is set at the power supply potential VDD. When the falling transition of the input signal S21 occurs in this state, not only the pMOS transistor TD21 but also the nMOS transistor TD23 is turned ON. This shortens the time period necessary for the falling transition (e.g., for the activation) of the signal to be transmitted via the signal line GL21. As the potential of the signal line GL21 becomes lower than the threshold value of the receiver circuit RC21, the nMOS transistor TD24 is turned OFF. Thus, not only the pMOS transistor TD21 but also the nMOS transistor TD23 is turned ON when the potential of the signal line GL21 is lowered, so that the signal transmission via the signal line GL21 can be speeded up. When the drive of the signal line GL21 by the nMOS transistor TD23 becomes unnecessary, on the other hand, the nMOS transistor TD24 is turned OFF. Therefore, it is possible to avoid an excessive potential supply from the ground line VSS to the signal line GL21.

Figure 11:
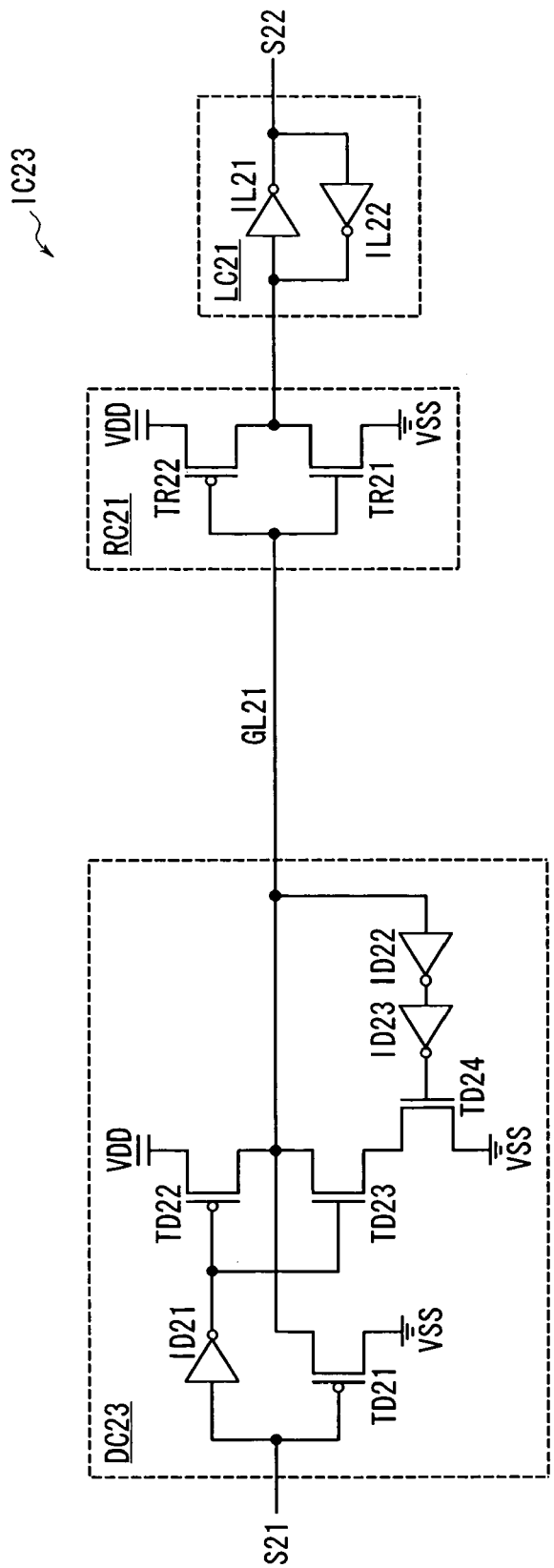
FIG. 11 is an explanatory diagram showing a seventh embodiment of the invention.

FIG. 11 shows a seventh embodiment of the invention. For the description of the seventh embodiment, the same components as those described in connection with the fifth and sixth embodiments are omitted in their detail description by designating them by the common reference numerals. A semiconductor integrated circuit IC23 is configured with a driver circuit DC23 instead of the driver circuit DC22 of the semiconductor integrated circuit IC22 (FIG. 10). The driver circuit DC23 is configured by adding an inverter ID22 (e.g., a detection circuit) and an inverter ID23 to the driver circuit DC22. The input terminal of the inverter ID22 is connected with the signal line GL21. The output terminal of the inverter ID22 and the input terminal of the inverter ID23 are connected with each other. The output terminal of the inverter ID23 is connected with the gate of the nMOS transistor TD24.

In the semiconductor integrated circuit IC23 thus configured, the inverter ID22 has the same circuit configuration as that of the receiver circuit RC21 so that the rising transition and the falling transition occur at a substantially identical timing in the output signal of the inverter ID22 and the output signal of the receiver circuit RC21. By controlling the ON/OFF of the nMOS transistor TD24 with the output signal of the inverter ID23 (e.g., the inverted signal of the output signal of the inverter ID22), therefore, the nMOS transistor TD24 can be turned OFF simultaneously as the drive of the signal line GL21 by the nMOS transistor TD23 becomes unnecessary. As a result, it is possible to reliably avoid an excessive potential supply from the ground line VSS to the signal line GL21.

Figure 12:
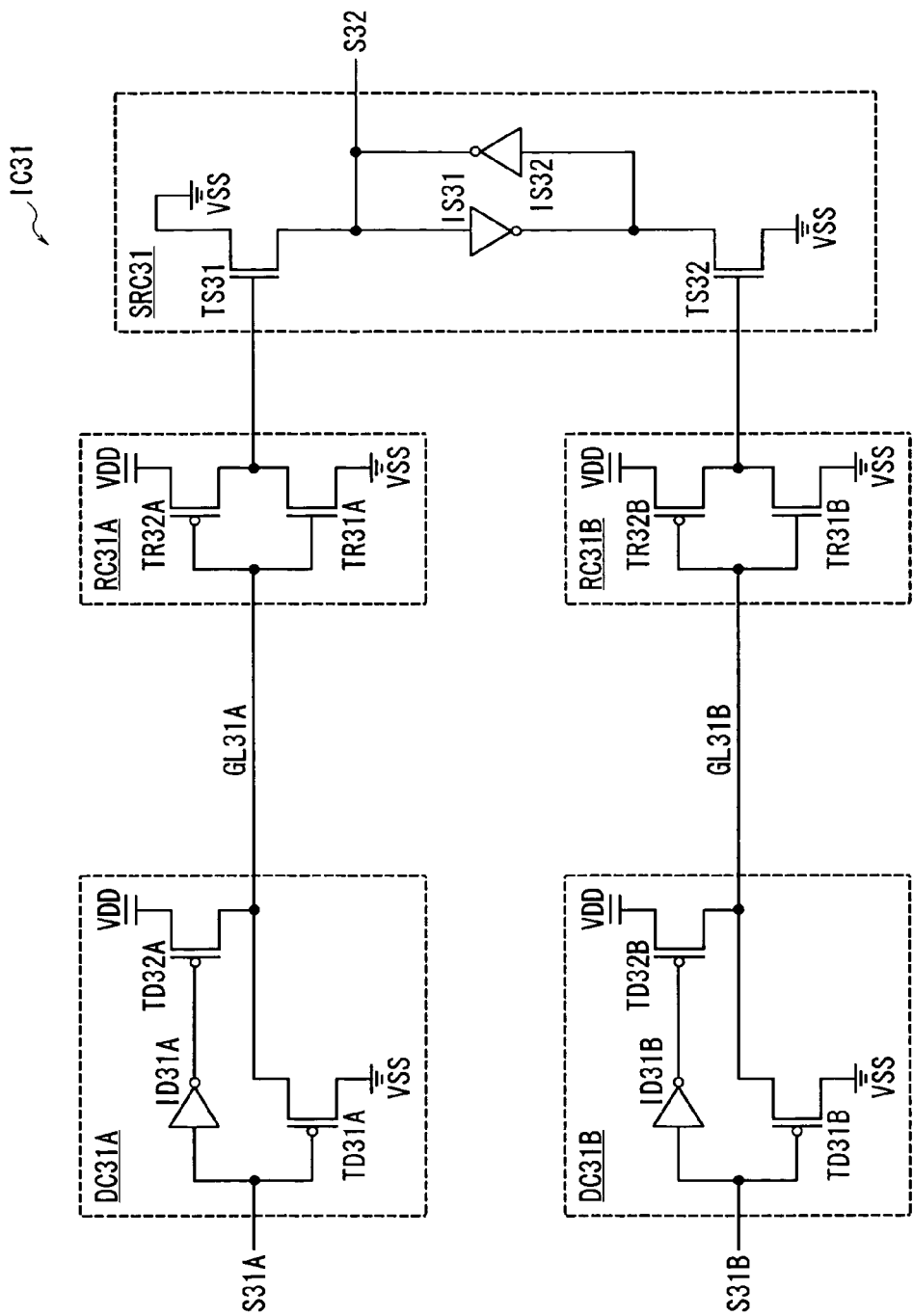
FIG. 12 is an explanatory diagram showing an eighth embodiment of the invention.

FIG. 12 shows an eighth embodiment of the invention. A semiconductor integrated circuit IC31 is configured to include: a positive-phase side signal line GL31A; a negative-phase side signal line GL31B; a positive-phase side driver circuit DC31A for driving the signal line GL31A in accordance with an input signal S31A; a negative-phase side driver circuit DC31B for driving the signal line GL31B in accordance with an input signal S31B; a positive-phase side receiver circuit RC31A for generating an output signal in accordance with the potential of the signal line GL31A; a negative-phase side receiver circuit RC31B for generating an output signal in accordance with the potential of the signal line GL31B; and a set/reset circuit SRC31 (e.g., a state transition circuit) having its operation state transited in response to the output signals of the receiver circuits RC31A and RC31B. For example, the driver circuits DC31A and DC31B and the receiver circuits RC31A and RC31B are individually disposed in different circuit blocks arranged at a spacing. The set/reset circuit SRC31 is disposed in the same circuit block as that of the receiver circuits RC31A and RC31B. The signal lines GL31A and GL31B are global signal lines of large loads.

The driver circuit DC31A includes a pMOS transistor TD31A (e.g., a positive-phase side first p-type transistor), a pMOS transistor TD32A (e.g., a positive-phase side second p-type transistor) and an inverter ID31A. The pMOS transistor TD31A has its source connected with the signal line GL31A. The pMOS transistor TD31A has its drain connected with the ground line VSS (e.g., a low power supply line). The gate of the pMOS transistor TD31A receives the input signal S31A. The pMOS transistor TD32A has its source connected with the power supply line VDD (e.g., a high power supply line). The pMOS transistor TD32A has its drain connected with the signal line GL31A. The gate of the pMOS transistor TD32A receives the input signal S31A through the inverter ID31A. In other words, the gate of the pMOS transistor TD32A receives the inverted signal of the input signal S31A. The input signal S31A is a positive-phase pulse signal of a negative logic to be fed from a circuit displayed in the same circuit block as that of the driver circuits DC31A and DC31B, for example, and has an amplitude from the ground potential VSS (at an active level) to the power supply potential VDD (at an inactive level).

The driver circuit DC31B includes a pMOS transistor TD31B (e.g., a negative-phase side first p-type transistor), a pMOS transistor TD32B (e.g., a negative-phase side second p-type transistor) and an inverter ID31B. The pMOS transistor TD31B has its source connected with the signal line GL31B. The pMOS transistor TD31B has its drain connected with the ground line VSS. The gate of the pMOS transistor TD31B receives the input signal S31B. The pMOS transistor TD32B has its source connected with the power supply line VDD. The pMOS transistor TD32B has its drain connected with the signal line GL31B. The gate of the pMOS transistor TD32B receives the input signal S31B through the inverter ID31B. In other words, the gate of the pMOS transistor TD32B receives the inverted signal of the input signal S31B. The input signal S31B is a negative-phase pulse signal of a negative logic to be fed from a circuit displayed in the same circuit block as that of the driver circuits DC31A and DC31B, for example, and has an amplitude from the ground potential VSS (at an active level) to the power supply potential VDD (at an inactive level).

The receiver circuit RC31A includes an nMOS transistor TR31A and a pMOS transistor TR32A. The nMOS transistor TR31A has its source connected with the ground line VSS. The drain of the nMOS transistor TR31A and the drain of the pMOS transistor TR32A are connected with each other. The pMOS transistor TR32A has its source connected with the power supply line VDD. The gate of the nMOS transistor TR31A and the gate of the pMOS transistor TR32A are connected with the signal line GL31A. Thus, the receiver circuit RC31A is an inverter composed of the nMOS transistor TR31A and the pMOS transistor TR32A. The receiver circuit RC31A sets the output signal (e.g., the signal to be generated at the connection node between the nMOS transistor TR31A and the pMOS transistor TR32A) at the ground potential VSS, when the potential of the signal line GL31A is higher than a threshold value (e.g., about one half of the power supply potential VDD), and the output signal at the power source potential VDD when the potential of the signal line GL31A is lower than the threshold value.

The receiver circuit RC31B includes an nMOS transistor TR31B and a pMOS transistor TR32B. The nMOS transistor TR31B has its source connected with the ground line VSS. The drain of the nMOS transistor TR31B and the drain of the pMOS transistor TR32B are connected with each other. The pMOS transistor TR32B has its source connected with the power supply line VDD. The gate of the nMOS transistor TR31B and the gate of the pMOS transistor TR32B are connected with the signal line GL31B. Thus, the receiver circuit RC31B is an inverter composed of the nMOS transistor TR31B and the pMOS transistor TR32B. The receiver circuit RC31B sets the output signal (e.g., the signal to be generated at the connection node between the nMOS transistor TR31B and the pMOS transistor TR32B) at the ground potential VSS, when the potential of the signal line GL31B is higher than a threshold value (e.g., about one half of the power supply potential VDD), and the output signal at the power source potential VDD when the potential of the signal line GL31B is lower than the threshold value.

The set/reset circuit SRC31 includes nMOS transistors TS31 and TS32 and inverters IS31 and IS32. The nMOS transistor TS31 has its source connected with the ground line VSS. The drain of the nMOS transistor TS31, the input terminal of the inverter IS31 and the output terminal of the inverter IS32 are connected with each other. The drain of the nMOS transistor TS32, the output terminal of the inverter IS31 and the input terminal of the inverter IS32 are connected with each other. The nMOS transistor TS32 has its source connected with the ground line VSS. The nMOS transistor TS31 has its gate connected with the connection node between the nMOS transistor TR31A and the pMOS transistor TR32A in the receiver circuit RC31A. The gate of the nMOS transistor TS32 is connected with the connection node between the nMOS transistor TR31B and the pMOS transistor TR32B in the receiver circuit RC31B. The set/reset circuit SRC31 thus configured transits from a set state to a reset state in response to the rising transition of the output signal of the receiver circuit RC31A, to set an output signal S32 (e.g., a signal to be generated at the connection node between the input terminal of the inverter IS31 and the output terminal of the inverter IS32) at the ground potential VSS. In response to the rising transition of the output signal of the receiver circuit RC31B, moreover, the set/reset circuit SRC31 transits from the reset state to the set state to set the output signal S32 at the power supply potential VDD.

Figure 13:
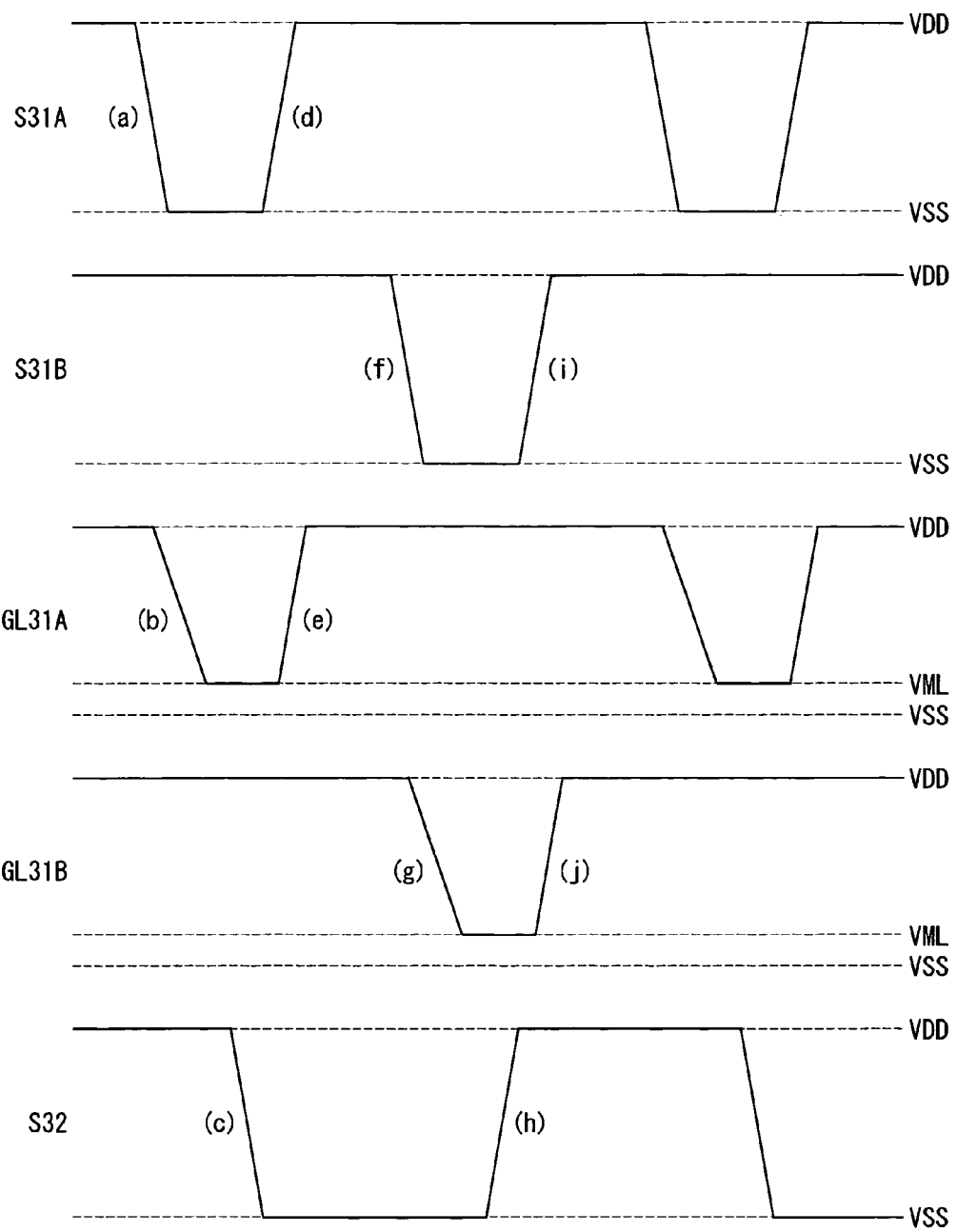
FIG. 13 is an explanatory diagram showing operation waveforms of the eighth embodiment of the invention.

FIG. 13 shows operation waveforms of the eighth embodiment of the invention. The pMOS transistors TD31A and TD31B are turned ON, when the gate-to-source voltage becomes lower than the threshold voltage Vthp, and OFF when the gate-to-source voltage becomes higher than the threshold voltage Vthp. When the input signal S31A transits from the power supply potential VDD to the ground potential VSS (FIG. 13(a)), therefore, the pMOS transistor TD31A is turned ON, and the pMOS transistor TD32A is turned OFF so that the potential of the signal line GL31A is lowered (FIG. 13(b)). When the potential of the signal line GL31A is lowered to the intermediate potential VML (VSS+ |Vthp|), the pMOS transistor TD31A is turned OFF. When the potential of the signal line GL31A becomes lower than the threshold value of the receiver circuit RC31A, on the other hand, the output signal of the receiver circuit RC31A transits from the ground potential VSS to the power supply potential VDD, the output signal S32 of the set/reset circuit SRC31 transits from the power supply potential VDD to the ground potential VSS (FIG. 13(c)). When the input signal S31A transits from the ground potential VSS to the power supply potential VDD (FIG. 13(d)), moreover, the pMOS transistor TD32A is turned ON to raise the potential of the signal line GL31A to the power supply potential VDD (FIG. 13(e)).

When the input signal S31B then transits from the power supply potential VDD to the ground potential VSS (FIG. 13(f)), the pMOS transistor TD31B is turned ON, and the pMOS transistor TD32B is turned OFF to lower the potential of the signal line GL31B (FIG. 13(g)). When the potential of the signal line GL31B is lowered to the intermediate potential VML, the pMOS transistor TD31B is turned OFF. When the potential of the signal line GL31B becomes lower than the threshold value of the receiver circuit RC31B, on the other hand, the output signal of the receiver circuit RC31B transits from the ground potential VSS to the power supply potential VDD so that the output signal S32 of the set/reset circuit SRC31 transits from the ground potential VSS to the power supply potential VDD (FIG. 13(h)). When the input signal S31B transits from the ground potential VSS to the power supply potential VDD (FIG. 13(i)), the pMOS transistor TD32B is turned ON to raise the potential of the signal line GL31B to the power supply potentiaL VDD (FIG. 13(j)).

Thus, in the semiconductor integrated circuit IC31, the amplitudes of the signals to be transmitted via the signal lines GL31A and GL31B of large loads can be reduced to an amplitude from the intermediate potential VML to the power supply potential VDD. As a result, the power consumption due to the signal lines GL31A and GL31B of large loads can be reduced to make a high contribution to the low power consumption of the semiconductor integrated circuit IC31.

Figure 14:
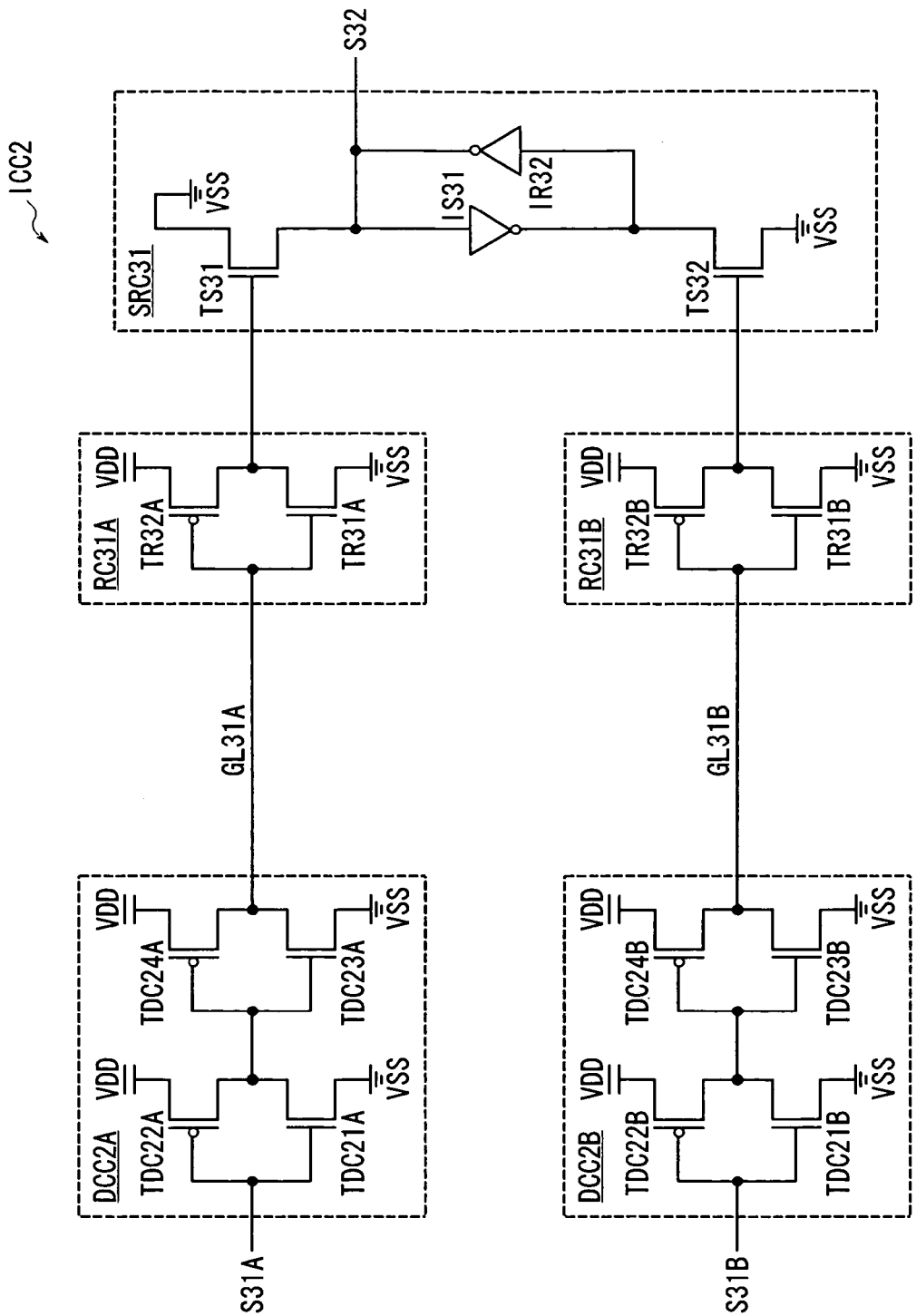
FIG. 14 is an explanatory diagram showing a second comparison of the invention.

FIG. 14 shows a second comparison of the invention. For the description of the second comparison, the same components as those described in connection with the eighth embodiment are omitted in their detail description by designating them by the common reference numerals. A semiconductor integrated circuit ICC2 is configured with a positive-phase side driver circuit DCC2A and a negative-phase side driver circuit DCC2B instead of the positive-phase side driver circuit DC31A and the negative-phase side driver circuit DC31B of the semiconductor integrated circuit IC31 (FIG. 12).

The driver circuit DCC2A includes nMOS transistors TDC21A and TDC23A and pMOS transistors TDC22A and TDC24A. The nMOS transistor TDC21A has its source connected with the ground line VSS. The drain of the nMOS transistor TDC21A and the drain of the pMOS transistor TDC22A are connected with each other. The pMOS transistor TDC22A has its source connected with the power supply line VDD. The gate of the nMOS transistor TDC21A and the gate of the pMOS transistor TDC22A receive the input signal S31A. The nMOS transistor TDC23A has its source connected with the ground line VSS. The drain of the nMOS transistor TDC23A and the drain of the pMOS transistor TDC24A are connected with the signal line GL31A. The pMOS transistor TDC24A has its source connected with the power supply line VDD. The gate of the nMOS transistor TDC23A and the gate of the pMOS transistor TDC24A are connected with the connection node between of the nMOS transistor TDC21A and the pMOS transistor TDC22A. Specifically, the driver circuit DCC2A is configured by serially connecting an inverter composed of an nMOS transistor TDC11A and a pMOS transistor TDC12A, and an inverter composed of the nMOS transistor TDC23A and the pMOS transistor TDC24A.

The driver circuit DCC2B includes nMOS transistors TDC21B and TDC23B and pMOS transistors TDC22B and TDC24B. The nMOS transistor TDC21B has its source connected with the ground line VSS. The drain of the nMOS transistor TDC21B and the drain of the pMOS transistor TDC22B are connected with each other. The pMOS transistor TDC22B has its source connected with the power supply line VDD. The gate of the nMOS transistor TDC21B and the gate of the pMOS transistor TDC22B receive the input signal S31B. The nMOS transistor TDC23B has its source connected with the ground line VSS. The drain of the nMOS transistor TDC23B and the drain of the pMOS transistor TDC24B are connected with the signal line GL31B. The pMOS transistor TDC24B has its source connected with the power supply line VDD. The gate of the nMOS transistor TDC23B and the gate of the pMOS transistor TDC24B are connected with the connection node between the nMOS transistor TDC21B and the pMOS transistor TDC22B. Specifically, the driver circuit DCC2B is configured by serially connecting an inverter composed of an nMOS transistor TDC21B and a pMOS transistor TDC22B, and an inverter composed of the nMOS transistor TDC23B and the pMOS transistor TDC24B.

In the semiconductor integrated circuit ICC2 thus configured, the signals to be transmitted via the signal lines GL31A and GL31B have amplitudes from the ground potential VSS to the power supply potential VDD. Therefore, the semiconductor integrated circuit ICC2 has a more power consumption due to the signal lines GL31A and GL31B of large loads than that of the semiconductor integrated circuit IC31.

Figure 15:
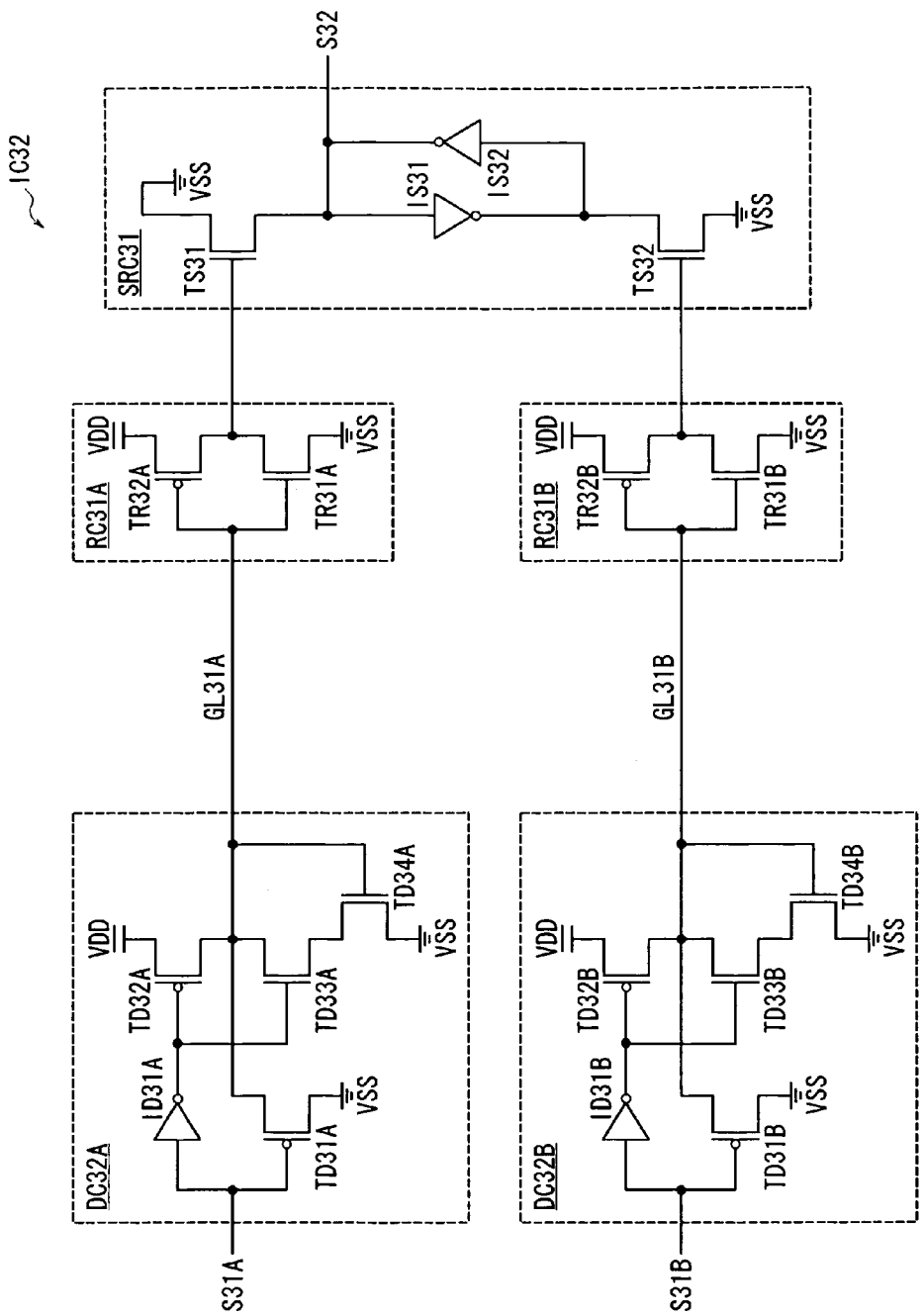
FIG. 15 is an explanatory diagram showing a ninth embodiment of the invention.

FIG. 15 shows a ninth embodiment of the invention. For the description of the ninth embodiment, the same components as those described in connection with the eighth embodiment are omitted in their detail description by designating them by the common reference numerals. A semiconductor integrated circuit IC32 is configured with a positive-phase side driver circuit DC32A and a negative-phase side driver circuit DC32B instead of the positive-phase side driver circuit DC31A and the negative-phase side driver circuit DC31B of the semiconductor integrated circuit IC31 (FIG. 12).

The driver circuit DC32A is configured by adding an nMOS transistor TD33A (e.g., a positive-phase side n-type transistor) and an nMOS transistor TD34A (e.g., a positive-phase side switch circuit) to the driver circuit DC31A. The nMOS transistor TD34A has its drain connected with the signal line GL31A. The source of the nMOS transistor TD33A and the drain of the nMOS transistor TD34A are connected with each other. The nMOS transistor TD34A has its source connected with the ground line VSS. The gate of the nMOS transistor TD33A receives the input signal S31A through an inverter ID31A. In other words, the gate of the nMOS transistor TD33A receives the inverted signal of the input signal S31A. The nMOS transistor TD34A has its gate connected with the signal line GL31A.

The driver circuit DC32B is configured to include an nMOS transistor TD33B (e.g., a negative-phase side n-type transistor) and an nMOS transistor TD34B (e.g., a negative-phase side switch circuit) for the driver circuit DC31B. The nMOS transistor TD33B has its drain connected with the signal line GL31B. The source of the nMOS transistor TD33B and the drain of the nMOS transistor TD34B are connected with each other. The nMOS transistor TD34B has its source connected with the ground line VSS. The gate of the nMOS transistor TD33B receives the input signal S31B through the inverter ID31B. In other words, the gate of the nMOS transistor TD33B receives the inverted signal of the input signal S31B. The nMOS transistor TD34B has its gate connected with the signal line GL31B.

In the semiconductor integrated circuit IC32 thus configured, the nMOS transistor TD34A is turned ON when the signal line GL31A is set at the power supply potential VDD. When the falling transition of the input signal S31A occurs in this state, not only the nMOS transistor TD31A but also the nMOS transistor TD33A is turned ON. This shortens the time period necessary for the falling transition (e.g., for the activation) of the signal to be transmitted via the signal line GL31A. As the potential of the signal line GL31A becomes lower than the threshold value of the receiver circuit RC31A, the nMOS transistor TD34A is turned OFF. Thus, when the potential of the signal line GL31A is lowered, not only the pMOS transistor TD31A but also the nMOS transistor TD33A is turned ON so that the signal transmission via the signal line GL31A can be speeded up. When the drive of the signal line GL31A by the nMOS transistor TD33A becomes unnecessary, on the other hand, the nMOS transistor TD34A is turned OFF. This makes it possible to avoid an excessive potential supply from the ground line VSS to the signal line GL31A.

Likewise, the nMOS transistor TD34B is turned ON when the signal line GL31B is set at the power supply potential VDD. When the falling transition of the input signal S31B occurs in this state, not only the pMOS transistor TD31B but also the nMOS transistor TD33B is turned ON. This shortens the time period necessary for the falling transition (e.g., for the activation) of the signal to be transmitted via the signal line GL31B. As the potential of the signal line GL31B becomes lower than the threshold value of the receiver circuit RC31B, the nMOS transistor TD34B is turned OFF. Thus, when the potential of the signal line GL31B is lowered, not only the pMOS transistor TD31B but also the nMOS transistor TD33B is turned ON so that the signal transmission via the signal line GL31B can be speeded up. When the drive of the signal line GL31B by the nMOS transistor TD33B becomes unnecessary, on the other hand, the nMOS transistor TD34B is turned OFF. This makes it possible to avoid an excessive potential supply from the ground line VSS to the signal line GL31B.

Figure 16:
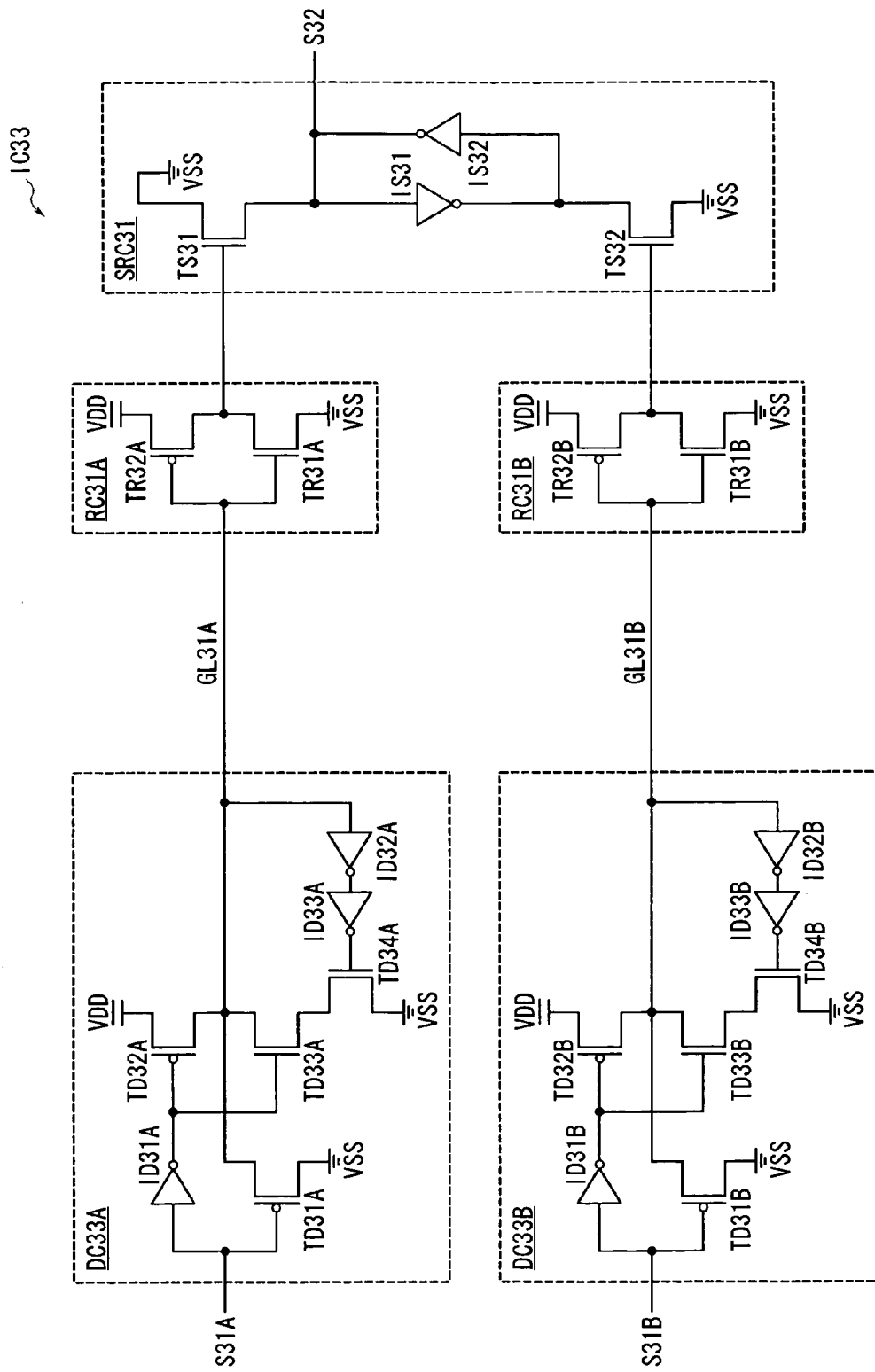
FIG. 16 is an explanatory diagram showing a tenth embodiment of the invention.

FIG. 16 shows a tenth embodiment of the invention. For the description of the tenth embodiment, the same components as those described in connection with the eighth and ninth embodiments are omitted in their detail description by designating them by the common reference numerals. A semiconductor integrated circuit IC33 is configured with a positive-phase side driver circuit DC33A and a negative-phase side driver circuit DC33B instead of the positive-phase side driver circuit DC32A and the negative-phase side driver circuit DC32B of the semiconductor integrated circuit IC32 (FIG. 15).

The driver circuit DC33A is configured by adding an inverter ID32A (e.g., a positive-phase side detection circuit) and an inverter ID33A to the driver circuit DC32A. The input terminal of the inverter ID32A is connected with the signal line GL31A. The output terminal of the inverter ID32A and the input terminal of the inverter ID33A are connected with each other. The output terminal of the inverter ID33A is connected with the gate of an nMOS transistor TD34A.

The driver circuit DC33B is configured by adding an inverter ID32B (e.g., a negative-phase side detection circuit) and an inverter ID33B to the driver circuit DC32B. The input terminal of the inverter ID32B is connected with the signal line GL31B. The output terminal of the inverter ID32B and the input terminal of the inverter ID33B are connected with each other. The output terminal of the inverter ID33B is connected with the gate of an nMOS transistor TD34B.

In the semiconductor integrated circuit IC33 thus configured, the inverter ID32A has the same circuit configuration as that of the receiver circuit RC31A so that the rising transition and the falling transition occur at a substantially identical timing in the output signal of the inverter ID32A and the output signal of the receiver circuit RC31A. By controlling the ON/OFF of the nMOS transistor TD34A with the output signal of the inverter ID33A (e.g., the inverted signal of the output signal of the inverter ID32A), therefore, the nMOS transistor TD34A can be turned OFF simultaneously as the drive of the signal line GL31A by the nMOS transistor TD33A becomes unnecessary. As a result, it is possible to reliably avoid an excessive potential supply from the ground line VSS to the signal line GL31A.

Likewise, the inverter ID32B has the same circuit configuration as that of the receiver circuit RC31B so that the rising transition and the falling transition occur at a substantially identical timing in the output signal of the inverter ID32B and the output signal of the receiver circuit RC31B. By controlling the ON/OFF of the nMOS transistor TD34B with the output signal of the inverter ID33B (e.g., the inverted signal of the output signal of the inverter ID32B), therefore, the nMOS transistor TD34B can be turned OFF simultaneously as the drive of the signal line GL31B by the nMOS transistor TD33B becomes unnecessary. As a result, it is possible to reliably avoid an excessive potential supply from the ground line VSS to the signal line GL31B.

Figure 17:
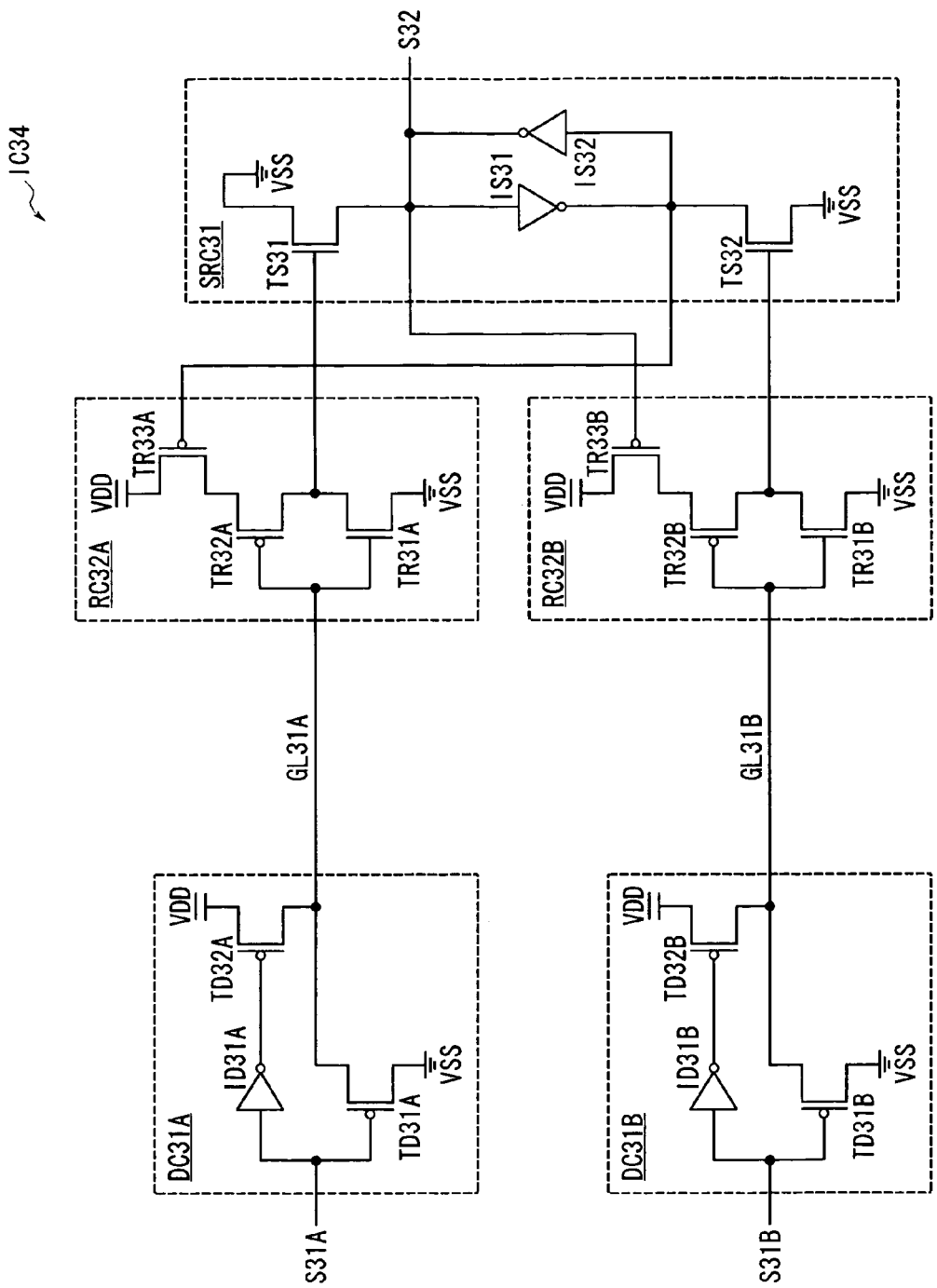
FIG. 17 is an explanatory diagram showing an eleventh embodiment of the invention.

FIG. 17 shows an eleventh embodiment of the invention. For the description of the eleventh embodiment, the same components as those described in connection with the eighth embodiment are omitted in their detail description by designating them by the common reference numerals. A semiconductor integrated circuit IC34 is configured with a positive-phase side receiver circuit RC32A and a negative-phase side receiver circuit RC32B instead of the positive-phase side receiver circuit RC31A and the negative-phase side receiver circuit RC31B of the semiconductor integrated circuit IC31 (FIG. 12).

The receiver circuit RC32A is configured by adding a pMOS transistor TR33A (e.g., a positive-phase side cut-off circuit) to the receiver circuit RC31A. The pMOS transistor TR33A has its source connected with the power supply line VDD. The pMOS transistor TR33A has its drain connected with the source of the pMOS transistor TR32A. The pMOS transistor TR33A has its gate connected with the connection node between the nMOS transistor TS32 and the inverters IS31 and IS32 in the set/reset circuit SRC31. In other words, the gate of the pMOS transistor TR33A receives the inverted signal of the output signal S32 of the set/reset circuit SRC31. Therefore, the pMOS transistor TR33A is turned ON in response to the transition of the set/reset circuit SRC31 from the reset state to the set state, and is turned OFF in response to the transition of the set/reset circuit SRC31 from the set state to the reset state.

The receiver circuit RC32B is configured by adding a pMOS transistor TR33B (e.g., a negative-phase side cut-off circuit) to the receiver circuit RC31B. The pMOS transistor TR33B has its source connected with the power supply line VDD. The pMOS transistor TR33B has its drain connected with the source of the pMOS transistor TR32B. The gate of the pMOS transistor TR33B is connected with the connection node between the nMOS transistor TS31 and the inverters IS31 and IS32 in the latch circuit SRC31. In other words, the gate of the pMOS transistor TR33B receives the output signal S32 of the set/reset circuit SRC31. As a result, the pMOS transistor TR33B is turned ON in response to the transition of the set/reset circuit SRC31 from the set state to the reset state, and is turned OFF in response to the transition of the set/reset circuit SRC31 from the reset state to the set state.

In the semiconductor integrated circuit IC34 thus configured, the pMOS transistor TR33A in the receiver circuit RC32A is turned OFF when the set/reset circuit SRC31 transits from the set state to the reset state. As a result, the potential supply from the power supply line VDD to the pMOS transistor TR32A is cut off. Therefore, it is possible to suppress the feedthrough current which is generated as a result that the signal to be transmitted via the signal line GL31A is set at the intermediate potential VML. On the other hand, the pMOS transistor TR33B in the receiver circuit RC32B is turned OFF when the set/reset circuit SRC31 transits from the reset state to the set state. As a result, the potential supply from the power supply line VDD to the pMOS transistor TR32B is cut off. Therefore, it is possible to suppress the feedthrough current which is generated as a result that the signal to be transmitted via the signal line GL31B is set at the intermediate potential VML.

Figure 18:
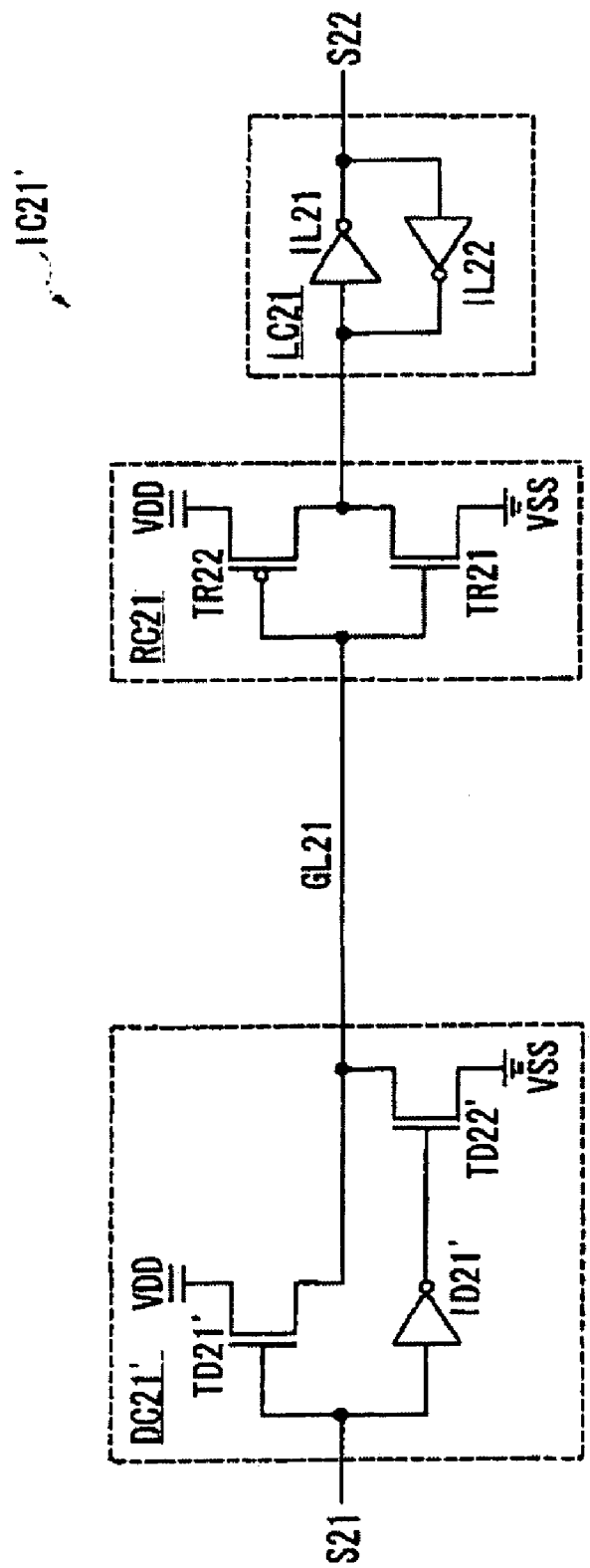
FIG. 18 is an explanatory diagram showing another example of the fifth embodiment of the invention.
Figure 19:
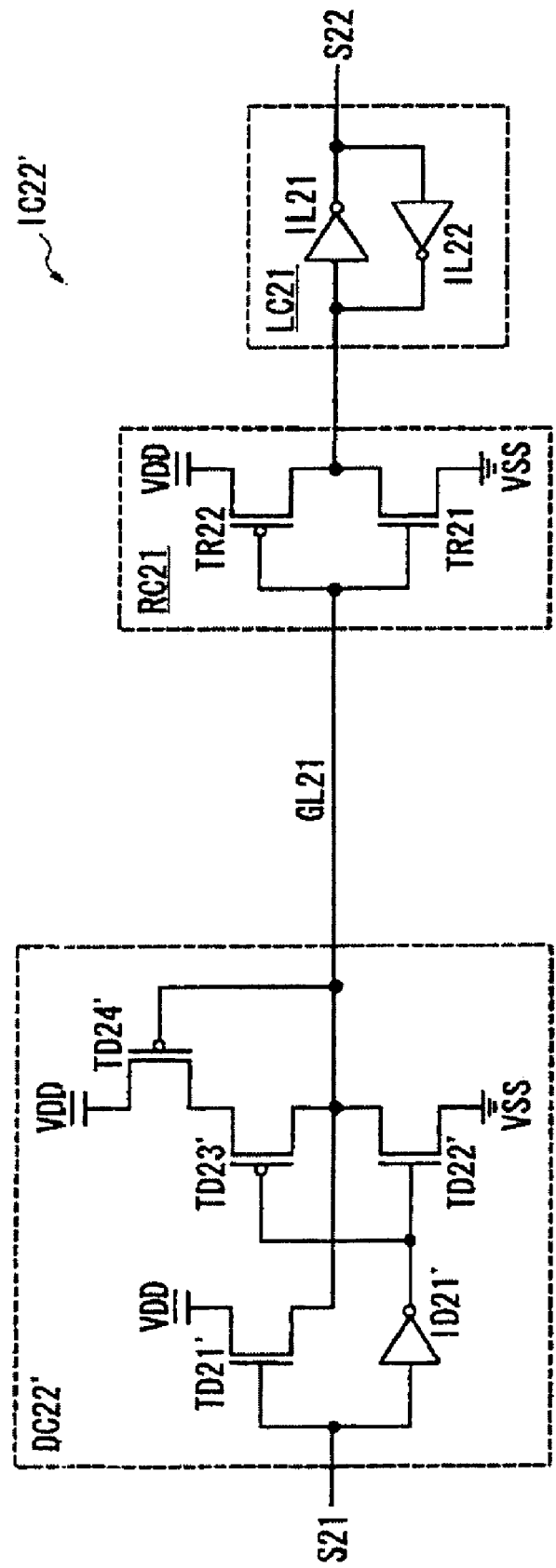
FIG. 19 is an explanatory diagram showing another example of the sixth embodiment of the invention.
Figure 20:
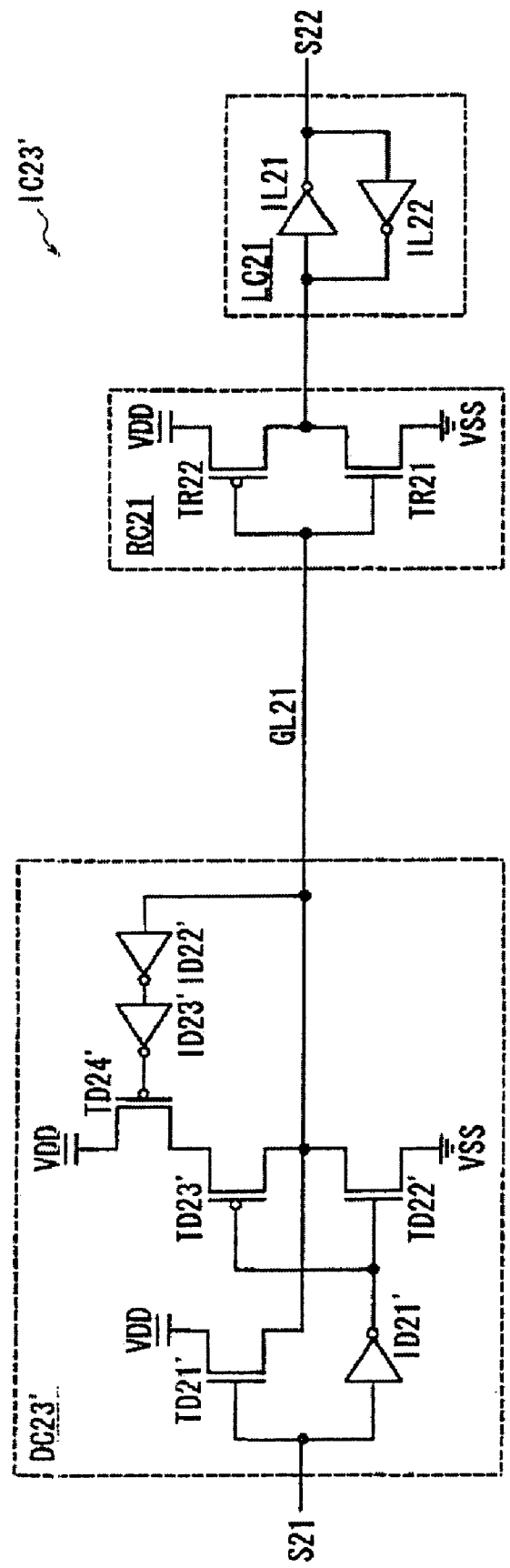
FIG. 20 is an explanatory diagram showing another example of the seventh embodiment of the invention.
Figure 21:
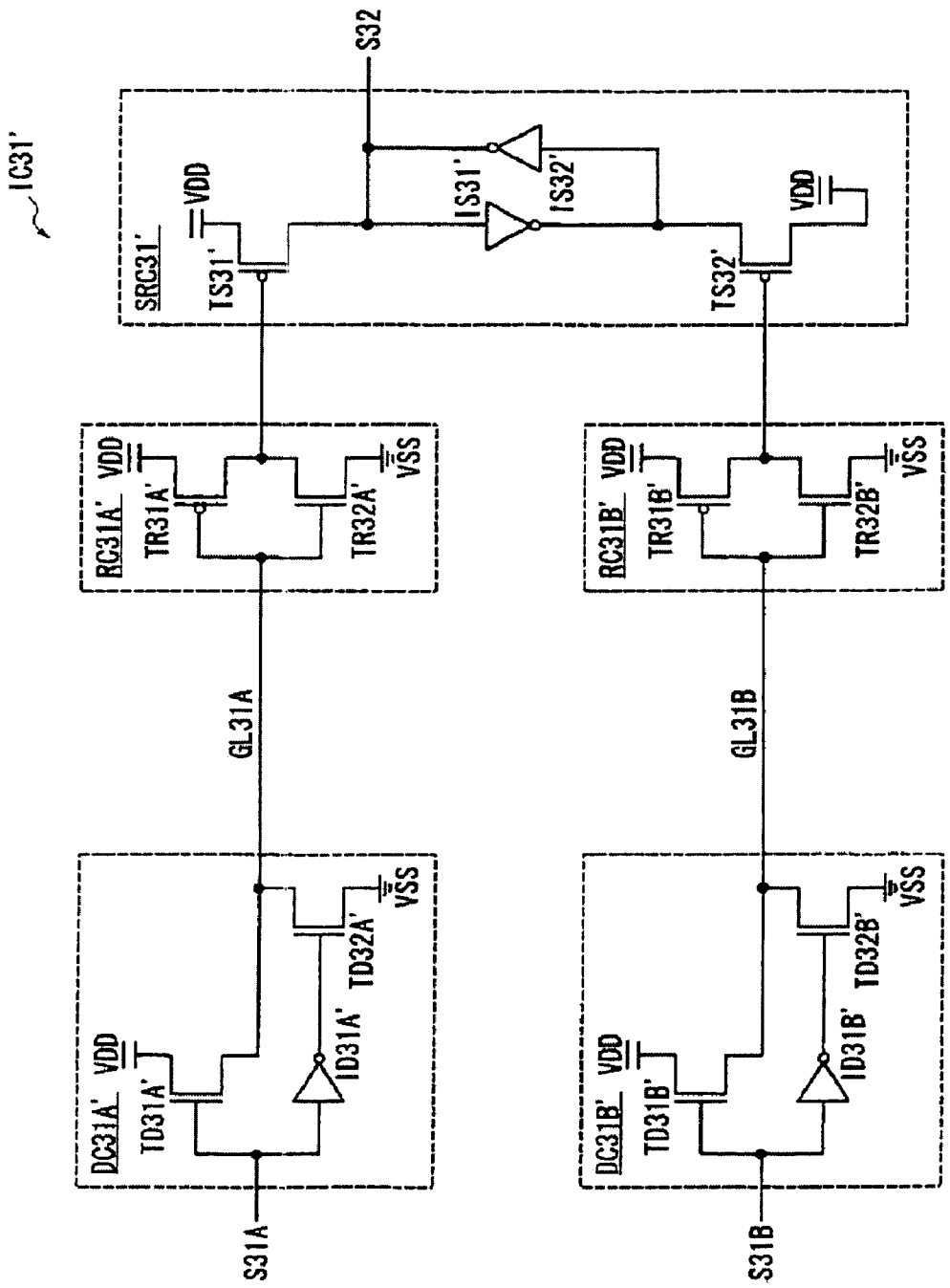
FIG. 21 is an explanatory diagram showing another example of the eighth embodiment of the invention.
Figure 22:
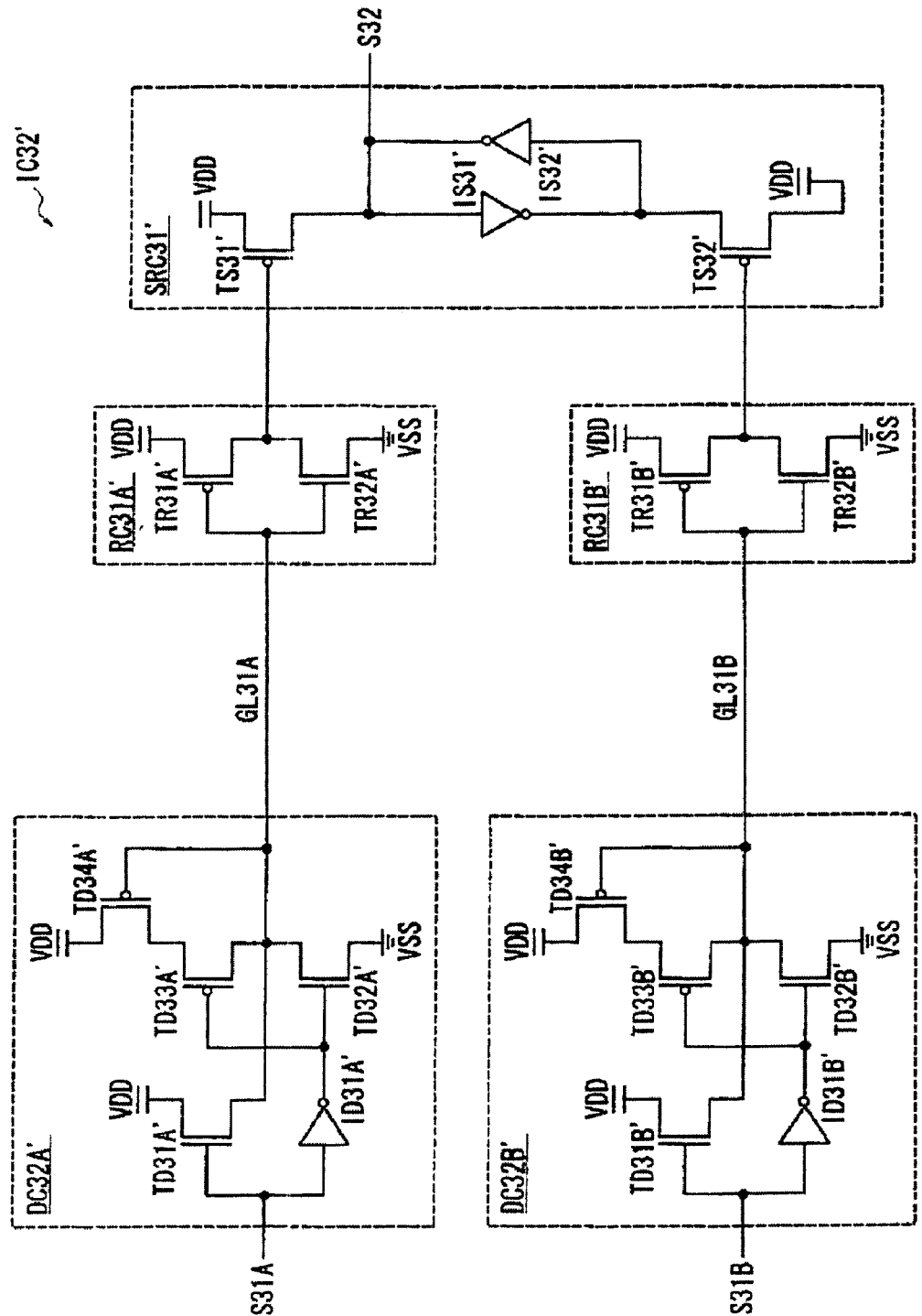
FIG. 22 is an explanatory diagram showing another example of the ninth embodiment of the invention.
Figure 23:
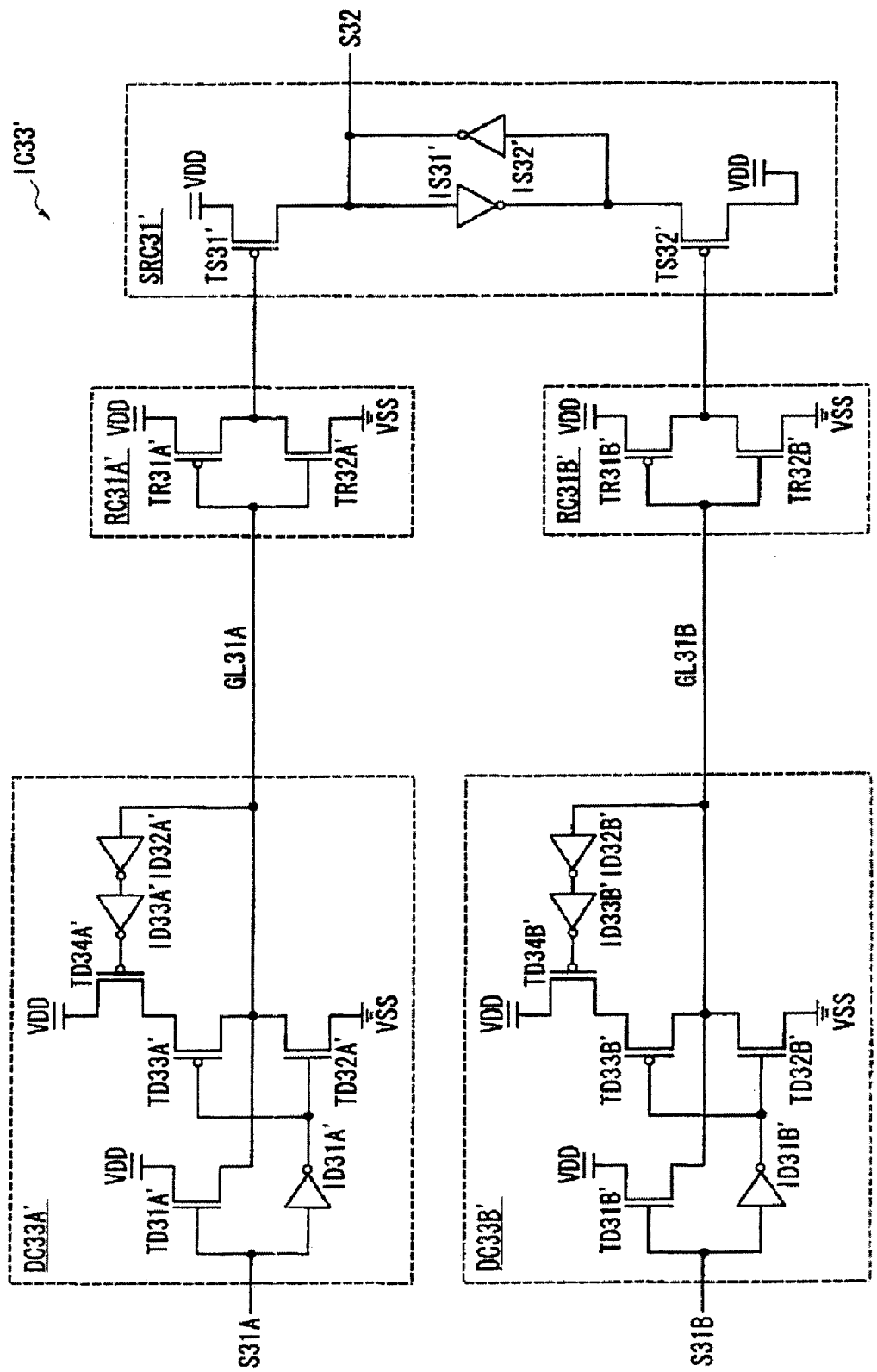
FIG. 23 is an explanatory diagram showing another example of the tenth embodiment of the invention.
Figure 24:
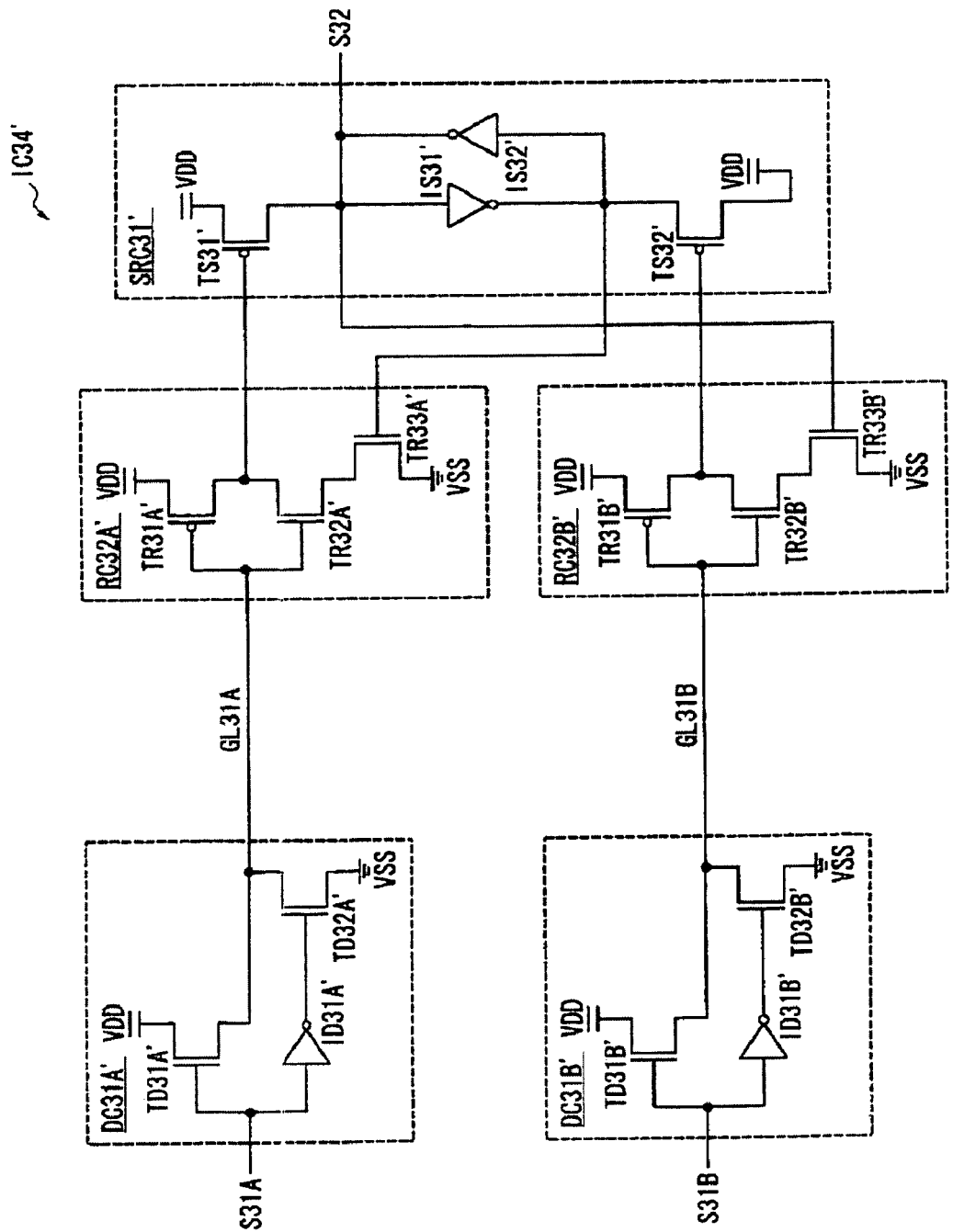
FIG. 24 is an explanatory diagram showing another example of the eleventh embodiment of the invention.

Here, the fifth to seventh embodiments have described the case in which the input signal of the driver circuit is the pulse signal of the negative logic. However, the invention should not be limited to those embodiments. In case that the input signal of the driver circuit is a pulse signal of a positive logic, for example, similar advantages can be obtained by the driver circuit with the power supply line and the ground line interchanged, the pMOS transistors in replace of the nMOS transistors, and the nMOS transistors in replace of the pMOS transistors, as shown in FIGS. 18-20.

Moreover, the eighth to eleventh embodiments have described the case in which the input signal of the driver circuit is the positive/negative-phase pulse signal of the negative logic. However, the invention should not be limited to those embodiments. In case that the input signal of the driver circuit is a positive/negative-phase pulse signal of a positive logic, for example, similar advantages can be obtained by the driver circuit, the receiver circuit and the set/reset circuit with the power supply line and the ground line interchanged, the pMOS transistors in replace of the nMOS transistors and the nMOS transistors is replace of the pMOS transistors. as shown in FIGS. 21-24, The invention is not limited to the above embodiments and various modifications may be made without departing from the spirit and scope of the invention. Any improvement may be made in part or all of the components.

What is claimed is:

1. A semiconductor integrated circuit comprising:
a signal line;
a driver circuit which drives said signal line in accordance with an input signal; and
a receiver circuit which sets an output signal at a potential of said low power supply line when a potential of said signal line is higher than a threshold value, and sets the output signal at a potential of said high power supply line when the potential of said signal line is lower than the threshold value, wherein said driver circuit includes:
a first p-type transistor having a source connected with said signal line, a drain connected with a low power supply line and a gate receiving the input signal;
a first n-type transistor having a source connected with said signal line, a drain connected with a high power supply line and a gate receiving the input signal;
a second n-type transistor having a drain connected with said signal line and a gate receiving an inverted signal of the input signal;
a second p-type transistor having a drain connected with said signal line and a gate receiving an inverted signal of the input signal;
a first switch circuit interposed between a source of said second n-type transistor and said low power supply line, and turned ON when the potential of said signal line becomes higher than the threshold value of said receiver circuit, and turned OFF when the potential of said signal line becomes lower than the threshold value of said receiver circuit; and
a second switch circuit interposed between a source of said second p-type transistor and said high power supply line, and turned ON when the potential of said signal line becomes lower than the threshold value of said receiver circuit, and turned OFF when the potential of said signal line becomes higher than the threshold value of said receiver circuit.

2. A semiconductor integrated circuit according to claim 1, wherein
said receiver circuit includes a cut-off circuit which cuts off potential supplies from said low power supply line and said high power supply line in response to an operation stop request.

3. A semiconductor integrated circuit according to claim 1, wherein:
said driver circuit includes a detection circuit disposed for detecting an interchange of magnitude relations between the potential of said signal line and the threshold value of said receiver circuit and having a circuit configuration identical to that of said receiver circuit;
said first switch circuit is turned ON in response to a falling transition of an output signal of said detection circuit, and turned OFF in response to a rising transition of the output signal of said detection circuit; and
said second switch circuit is turned ON in response to the rising transition of the output signal of said detection circuit, and turned OFF in response to the falling transition of the output signal of said detection circuit.

4. A semiconductor integrated circuit comprising:
a signal line;
a driver circuit which drives said signal line in accordance with an input signals; and
a receiver circuit which sets an output signal at a potential of said low power supply line when a potential of said signal line is higher than a threshold value, and sets the output signal at a potential of said high power supply line when the potential of said signal line is lower than the threshold value, wherein said driver circuit includes:
a first p-type transistor having a source connected with said signal line, a drain connected with a low power supply line and a gate receiving the input signal;
a second p-type transistor having a source connected with a high power supply line, a drain connected with said signal line and a gate receiving an inverted signal of the input signal;
an n-type transistor having a drain connected with said signal line and a gate receiving an inverted signal of the input signal; and
a switch circuit interposed between a source of said n-type transistor and said low power supply line, and turned ON when the potential of said signal line becomes higher than the threshold value of said receiver circuit, and turned OFF when the potential of said signal line becomes lower than the threshold value of said receiver circuit.

5. A semiconductor integrated circuit according to claim 4, wherein
said driver circuit includes a detection circuit disposed for detecting an interchange of magnitude relations between the potential of said signal line and the threshold value of said receiver circuit and having a circuit configuration identical to that of said receiver circuit; and
said switch circuit is turned ON in response to a falling transition of an output signal of said detection circuit, and turned OFF in response to a rising transition of the output signal of said detection circuit.

6. A semiconductor integrated circuit comprising:
a positive-phase side signal line;
a negative-phase side signal line;
a positive-phase side driver circuit which receives a positive-phase pulses signal of a negative logic as an input signal and drives said positive-phase side signal line in accordance with the input signal;
a negative-phase side driver circuit which receives a negative-phase pulse signal of a negative logic as an input signal and drives said negative-phase side signal line in accordance with the input signal;
a positive-phase side receiver circuit which sets an output signal at a potential of a lower power supply line when a potential of said positive-phase side signal line is higher than a threshold value, and sets the output signal at a potential of a high power supply line when the potential of said positive-phase side signal line is lower than the threshold value;
a negative-phase side receiver circuit which sets an output signal at the potential of said low power supply line when a potential of said negative-phase side signal line is higher than a threshold value, and sets the output signal at the potential of said high power supply line when the potential of said negative-phase side signal line is lower than the threshold value; and
a state transition circuit which transits from a first operation state to a second operation state in response to a rising transition of the output signal of said positive-phase side receiver circuit, and transits from the second operation state to the first operation state in response to a rising transition of the output signal of said negative-phase side receiver circuit, wherein said positive-phase side driver circuit includes;

a positive-phase side first p-type transistor having a source connected with said positive-phase side signal line, a drain connected with said low power supply line and a gate receiving an input signal; and a positive-phase side second p-type transistor having a source connected with said high power supply line, a drain connected with said positive-phase side signal line and a gate receiving an inverted signal of the input signal; and said negative-phase side driver circuit includes:

a negative-phase side first p-type transistor having a source connected with said negative-phase side signal line, a drain connected with said low power supply line and a gate receiving an input signal; and a negative-phase side second p-type transistor having a source connected with said high power supply line, a drain connected with said negative-phase side signal line and a gate receiving an inverted signal of the input signal.

7. A semiconductor integrated circuit according to claim 6, wherein said positive-phase side driver circuit includes:

a positive-phase side n-type transistor having a drain connected with said positive-phase side signal line and a gate receiving an inverted signal of an input signal; and a positive-phase side switch circuit interposed between a source of said positive-phase side n-type transistor and said low power supply line, and turned ON when the potential of said positive-phase side signal line becomes higher than the threshold value of said positive-phase side receiver circuit, and turned OFF when the potential of said positive-phase side signal line becomes lower than the threshold value of said positive-phase side receiver circuit; and said negative-phase side driver circuit includes:

a negative-phase side n-type transistor having a drain connected with said negative-phase side signal line and a gate receiving an inverted signal of an input signal; and a negative-phase side switch circuit interposed between a source of said negative-phase side n-type transistor and said low power supply line, and turned ON when the potential of said negative-phase side signal line becomes higher than the threshold value of said negative-phase side receiver circuit, and turned OFF when the potential of said negative-phase side signal line becomes lower than the threshold value of said negative-phase side receiver circuit.

8. A semiconductor integrated circuit according to claim 7, wherein:

said positive-phase side driver circuit includes a positive-phase side detection circuit disposed for detecting an interchange of magnitude relations between the potential of said positive-phase side signal line and the threshold value of said positive-phase side receiver circuit and having a circuit configuration identical to that of said positive-phase side receiver circuit;

said positive-phase side switch circuit is turned ON in response to a falling transition of an output signal of said positive-phase side detection circuit and turned OFF in response to a rising transition of the output signal of said positive-phase side detection circuit;

said negative-phase side driver circuit includes a negative-phase side detection circuit disposed for detecting an interchange of magnitude relations between the potential of said negative-phase side signal line and the threshold value of said negative-phase side receiver circuit and having a circuit configuration identical to that of said negative-phase side receiver circuit;

said negative-phase side switch circuit is turned ON in response to a falling transition of an output signal of said negative-phase side detection circuit and turned OFF in response to a rising transition of the output signal of said negative-phase side detection circuit.

9. A semiconductor integrated circuit according to claim 6, wherein:

said positive-phase side driver circuit includes a positive-phase side cut-off circuit which cuts off a potential supply from said high power supply line in response to a transition of said state transition circuit from the first operation state to the second operation state; and said negative-phase side receiver circuit includes a negative-phase side cut-off circuit which cuts off a potential supply from said high power supply line in response to a transition of said state transition circuit from the second operation state to the first operation state.

10. A semiconductor integrated circuit comprising:

a signal line;

a driver circuit which receives a pulse signal of a positive logic as an input signal and drives said signal line in accordance with the input signal; and a receiver circuit which sets an output signal at a potential of said low power supply line when a potential of said signal line is higher than a threshold value, and sets the output signal at a potential of said high power supply line when the potential of said signal line is lower than the threshold value, wherein said driver circuit includes:

a first n-type transistor having a source connected with said signal line, a drain connected with a high power supply line and a gate receiving the input signal;

a second n-type transistor having a source connected with a low power supply line, a drain connected with said signal line, and a gate receiving an inverted signal of the input signal;

a p-type transistor having a drain connected with said signal line and a gate receiving the inverted signal of the input signal; and a switch circuit interposed between a source of said p-type transistor and said high power supply line, and turned ON when the potential of said signal line becomes lower than the threshold value of said receiver circuit, and turned OFF when the potential of said signal line becomes higher than the threshold value of said receiver circuit.

11. A semiconductor integrated circuit according to claim 10, wherein said driver circuit includes a detection circuit disposed for detecting an interchange of magnitude relations between the potential of said signal line and the threshold value of said receiver circuit and having a circuit configuration identical to that of said receiver circuit; and said switch circuit is turned ON in response to a rising transition of an output signal of said detection circuit, and turned OFF in response to a falling transition of the output signal of said detection unit.

12. A semiconductor integrated circuit comprising:

a positive-phase side signal line;

a negative-phase side signal line;

a positive-phase side driver circuit which receives a positive-phase pulses signal of a positive logic as an input signal and drives said positive-phase side signal line in accordance with the input signal;

a negative-phase side driver circuit which receives a negative-phase pulse signal of a positive logic as an input signal and drives said negative-phase side signal line in accordance with the input signal;

a positive-phase side receiver circuit which sets an output signal at a potential of a lower power supply line when a potential of said positive-phase side signal line is higher than a threshold value, and sets the output signal at a potential of a high power supply line when the potential of said positive-phase side signal line is lower than the threshold value;

a negative-phase side receiver circuit which sets an output signal at the potential of said low power supply line when a potential of said negative-phase side signal line is higher than a threshold value, and sets the output signal at the potential of said high power supply line when the potential of said negative-phase side signal line is lower than the threshold value; and a state transition circuit which transits from a first operation state to a second operation state in response to a falling transition of the output signal of said positive-phase side receiver circuit, and transits from the second operation state to the first operation state in response to a falling transition of the output signal of said negative-phase side receiver circuit, wherein said positive-phase side driver circuit includes:

a positive-phase side first n-type transistor having a source connected with said positive-phase side signal line, a drain connected with said high power supply line and a gate receiving an input signal; and a positive-phase side second n-type transistor having a source connected with said low power supply line, a drain connected with said positive-phase side signal line and a gate receiving an inverted signal of the input signal; and said negative-phase side driver circuit includes:

a negative-phase side first n-type transistor having a source connected with said negative-phase side signal line, a drain connected with said high power supply line and a gate receiving an input signal; and a negative-phase side second n-type transistor having a source connected with said low power supply line, a drain connected with said negative-phase side signal line and a gate receiving an inverted signal of the input signal.

13. A semiconductor integrated circuit according to claim 12, wherein said positive-phase side driver circuit includes:

a positive-phase side p-type transistor having a drain connected with said positive-phase side signal line and a gate receiving an inverted signal of an input signal; and a positive-phase side switch circuit interposed between a source of said positive-phase side p-type transistor and said high power supply line, and turned ON when the potential of said positive-phase side signal line becomes lower than the threshold value of said positive-phase side receiver circuit, and turned OFF when the potential of said positive-phase side signal line becomes higher than the threshold value of said positive-phase side receiver circuit; and said negative-phase side driver circuit includes:

a negative-phase side p-type transistor having a drain connected with said negative-phase side signal line and a gate receiving an inverted signal of an input signal; and a negative-phase side switch circuit interposed between a source of said negative-phase side p-type transistor and said high power supply line, and turned ON when the potential of said negative-phase side signal line becomes lower than the threshold value of said negative-phase side receiver circuit, and turned OFF when the potential of said negative-phase side signal line becomes higher than the threshold value of said negative-phase side receiver circuit.

14. A semiconductor integrated circuit according to claim 13, wherein:

said positive-phase side driver circuit includes a positive-phase side detection circuit disposed for detecting an interchange of magnitude relations between the potential of said positive-phase side signal line and the threshold value of said positive-phase side receiver circuit and having a circuit configuration identical to that of said positive-phase side receiver circuit;

said positive-phase side switch circuit is turned ON in response to a rising transition of an output signal of said positive-phase side detection circuit and turned OFF in response to a falling transition of the output signal of said positive-phase side detection circuit;

said negative-phase side driver circuit includes a negative-phase side detection circuit disposed for detecting an interchange of magnitude relations between the potential of said negative-phase side signal line and the threshold value of said negative-phase side receiver circuit and having a circuit configuration identical to that of said negative-phase side receiver circuit;

said negative-phase side switch circuit is turned ON in response to a rising transition of an output signal of said negative-phase side detection circuit and turned OFF in response to a falling transition of the output signal of said negative-phase side detection circuit.

15. A semiconductor integrated circuit according to claim 12, wherein:

said positive-phase side driver circuit includes a positive-phase side cut-off circuit which cuts off a potential supply from said low power supply line in response to a transition of said state transition circuit from the first operation state to the second operation state; and said negative-phase side receiver circuit includes a negative-phase side cut-off circuit which cuts off a potential supply from said low power supply line in response to a transition of said state transition circuit from the second operation state to the first operation state.

* * * * *